United States Patent
Welsko

(10) Patent No.: US 12,356,579 B1
(45) Date of Patent: *Jul. 8, 2025

(54) MODULAR DATA CENTER

(71) Applicant: Worldwide Environmental Services, LLC, Fort Washington, PA (US)

(72) Inventor: Mark Welsko, Fort Washington, PA (US)

(73) Assignee: Worldwide Environmental Services, LLC, Fort Washington, PA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/585,895

(22) Filed: Feb. 23, 2024

Related U.S. Application Data

(63) Continuation of application No. 18/128,728, filed on Mar. 30, 2023, now Pat. No. 11,917,788, which is a continuation of application No. 16/420,790, filed on May 23, 2019, now Pat. No. 11,622,468.

(60) Provisional application No. 62/679,108, filed on Jun. 1, 2018.

(51) Int. Cl.
*H05K 7/14* (2006.01)
*H05K 5/02* (2006.01)
*H05K 7/20* (2006.01)

(52) U.S. Cl.
CPC ......... *H05K 7/1497* (2013.01); *H05K 5/0256* (2013.01); *H05K 7/1492* (2013.01); *H05K 7/1495* (2013.01); *H05K 7/20136* (2013.01); *H05K 7/2029* (2013.01); *H05K 7/20745* (2013.01); *H05K 7/20827* (2013.01)

(58) Field of Classification Search
CPC ............ H05K 7/1497; H05K 7/2029; H05K 7/20745; H05K 7/20827; H05K 7/20136; H05K 7/1495

See application file for complete search history.

(56) References Cited

U.S. PATENT DOCUMENTS

| | | | |
|---|---|---|---|
| 7,492,057 B2 | 2/2009 | Baldwin et al. | |
| 8,305,757 B2 | 11/2012 | Keisling et al. | |
| 8,446,710 B2 | 5/2013 | Schmitt et al. | |
| 8,547,710 B2 | 10/2013 | Ruehl et al. | |
| 8,601,827 B2 | 12/2013 | Keisling et al. | |
| 8,624,433 B2* | 1/2014 | Whitted | G06F 1/30 307/64 |
| 8,638,008 B2 | 1/2014 | Baldwin et al. | |
| 8,743,543 B2 | 6/2014 | Clidaras et al. | |
| 8,781,637 B2 | 7/2014 | Eaves | |
| 9,184,795 B2* | 11/2015 | Eaves | H04B 3/542 |
| 9,186,378 B2 | 11/2015 | Reichard et al. | |
| 9,282,684 B2 | 3/2016 | Keisling et al. | |
| 9,419,436 B2 | 8/2016 | Eaves et al. | |
| 9,485,887 B1 | 11/2016 | Eichelberg et al. | |
| 9,577,242 B2 | 2/2017 | Coad et al. | |
| 9,590,404 B2 | 3/2017 | Bailey et al. | |

(Continued)

*Primary Examiner* — Lionel Nouketcha
(74) *Attorney, Agent, or Firm* — NEO IP

(57) ABSTRACT

A modular data center and a method of building a modular data center. The modular data center includes a site microgrid including at least one power converter connected to a direct current (DC) bus and a digital power system. The digital power system includes at least one digital power transmitter, a set of transmission lines, and at least one digital power receiver. The modular data center design uses an adiabatic cooling system to cool the modular data center.

17 Claims, 20 Drawing Sheets

(56) References Cited

U.S. PATENT DOCUMENTS

| | | |
|---|---|---|
| 9,763,366 B2 | 9/2017 | Keisling et al. |
| 9,800,051 B2 | 10/2017 | Laubenstein et al. |
| 9,853,689 B2 | 12/2017 | Eaves et al. |
| 2011/0083824 A1* | 4/2011 | Rogers ............... H05K 7/20754 |
| | | 312/236 |
| 2017/0064876 A1 | 3/2017 | Leckelt et al. |
| 2017/0105310 A1 | 4/2017 | Chen |
| 2017/0187188 A1 | 6/2017 | Guyon et al. |
| 2017/0214236 A1 | 7/2017 | Eaves |
| 2017/0229886 A1 | 8/2017 | Eaves |
| 2017/0269648 A1 | 9/2017 | Ruiz et al. |
| 2017/0359917 A1 | 12/2017 | Bailey et al. |
| 2017/0359922 A1 | 12/2017 | Bailey et al. |

\* cited by examiner

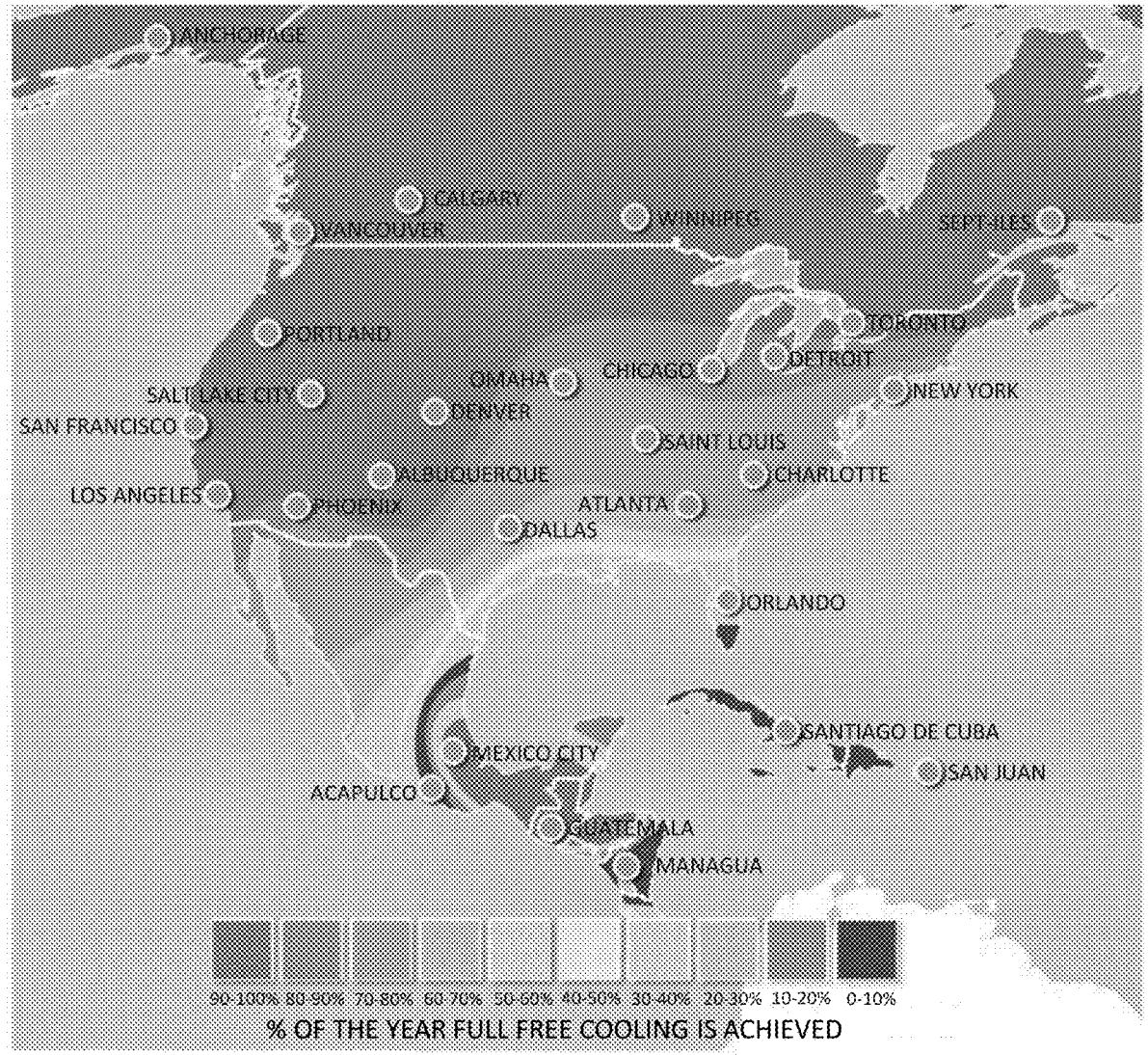

The above data is based on the following:

- Average annual weather data by CIBSE / ASHRAE
- Energy efficiency data is from Climate Emulator witnessed testing
- pPUE includes all losses from cooling, controls, and lighting within the Data Center
- pPUE includes all of the above losses, plus the primary electrical infrastructure based on 2N, 95% efficient UPS and N+1 generators
- Energy savings figures are based on an energy cost of 10¢ per kWh and a 5% annual energy price inflation rate

FIG. 7A

FREE COOLING: IT SUPPLY AT ASHRAE RECOMMENDED/ALLOWABLE (75.2°F 65% RH)

| | % Free Cooling | pPUE | PUE | 1MW 10 year savings vs PUE 1.5 | 1MW 10 year savings vs PUE 2 |
|---|---|---|---|---|---|
| Anchorage, Alaska | 100.00% | 1.05 | 1.14 | $3.97 million | $9.48 million |
| Calgary, Alberta | 100.00% | 1.05 | 1.14 | $3.97 million | $9.48 million |
| Salt Lake City, Utah | 100.00% | 1.05 | 1.14 | $3.97 million | $9.48 million |
| Mexico City, Mexico | 99.99% | 1.05 | 1.14 | $3.97 million | $9.48 million |
| Vancouver, British Columbia | 99.99% | 1.05 | 1.14 | $3.97 million | $9.48 million |
| San Francisco, California | 99.99% | 1.05 | 1.14 | $3.97 million | $9.48 million |
| Sept-Îles, Quebec | 99.95% | 1.05 | 1.14 | $3.97 million | $9.48 million |
| Albuquerque, New Mexico | 99.94% | 1.05 | 1.14 | $3.97 million | $9.48 million |
| Denver, Colorado | 99.93% | 1.05 | 1.14 | $3.97 million | $9.48 million |
| Portland, Oregon | 99.43% | 1.05 | 1.14 | $3.97 million | $9.48 million |
| Winnipeg, Manitoba | 95.87% | 1.06 | 1.15 | $3.86 million | $9.37 million |
| Los Angeles, California | 94.32% | 1.06 | 1.15 | $3.86 million | $9.37 million |
| Guatemala, Guatemala | 94.27% | 1.06 | 1.15 | $3.86 million | $9.37 million |
| Toronto, Ontario | 92.71% | 1.06 | 1.16 | $3.74 million | $9.24 million |
| Phoenix, Arizona | 88.96% | 1.09 | 1.19 | $3.42 million | $8.92 million |
| Detroit, Michigan | 88.11% | 1.08 | 1.17 | $3.64 million | $9.15 million |
| Chicago, Illinois | 86.23% | 1.08 | 1.18 | $3.53 million | $9.03 million |
| Saint Louis, Missouri | 79.91% | 1.10 | 1.20 | $3.31 million | $8.81 million |
| New York, New York | 79.81% | 1.10 | 1.19 | $3.42 million | $8.92 million |
| Omaha, Nebraska | 75.28% | 1.11 | 1.21 | $3.20 million | $8.70 million |
| Charlotte, North Carolina | 70.36% | 1.12 | 1.22 | $3.09 million | $8.59 million |
| Atlanta, Georgia | 70.20% | 1.22 | 1.22 | $3.09 million | $8.59 million |
| Dallas, Texas | 61.84% | 1.22 | 1.25 | $2.75 million | $8.26 million |
| Orlando, Florida | 39.22% | 1.31 | 1.31 | $2.09 million | $7.60 million |
| Santiago De Cuba, Cuba | 4.69% | 1.41 | 1.41 | $991,641 | $6.50 million |
| Managua, Nicaragua | 2.24% | 1.42 | 1.42 | $881,458 | $6.39 million |
| San Juan, Puerto Rico | 1.30% | 1.42 | 1.42 | $881,458 | $6.39 million |
| Acapulco, Mexico | 0.83% | 1.43 | 1.42 | $771,276 | $6.28 million |

FIG. 7B

MODULAR DATA CENTER

CROSS REFERENCES TO RELATED APPLICATIONS

This application is related to and claims priority from the following patent applications. This application is a continuation of U.S. patent application Ser. No. 18/128,728, filed Mar. 30, 2023, which is a continuation of U.S. patent application Ser. No. 16/420,790, filed May 23, 2019, which claims priority to and the benefit of U.S. Provisional Patent Application No. 62/679,108 filed Jun. 1, 2018, each of which is incorporated herein by reference in its entirety.

BACKGROUND OF THE INVENTION

1. Field of the Invention

The present invention relates to data centers, and more specifically to modular data centers.

2. Description of the Prior Art

It is generally known in the prior art to provide data centers to house servers, storage devices, cables, and internet connections. Data centers also generally include power systems, cooling systems, and fire suppression systems.

Representative prior art patent documents include the following:

U.S. Pat. No. 7,492,057 for high reliability DC power distribution system by inventors Baldwin, et al., filed Oct. 24, 2005 and issued Feb. 17, 2009, is directed to a high voltage DC power distribution system that eliminates static switches and batteries. Flywheel energy storage devices and extremely reliable, high power DC/DC converters provide at a lower cost, more reliable, noise and harmonic free, critical electrical power directly at equipment racks at 48 VDC, 24 VDC, 6 VDC, 2 VDC, or any other desired DC voltage level.

U.S. Pat. No. 8,305,757 for space-saving high-density modular data pod systems and energy-efficient cooling systems by inventors Keisling, et al., filed Dec. 28, 2011 and issued Nov. 6, 2012, is directed to a method of deploying space-saving, high-density modular data pods. The method includes installing a plurality of modular data pods in proximity to one another, each data pod including a fluid and electrical circuit section in fluidic and electrical communication with the modular data pod; and coupling a plurality of the fluid and electrical circuit sections in series with each other to form a fluid and electrical circuit having a first end and a second end. A modular data center includes a central cooling device coupled to a central cooling fluid circuit. The central cooling device supports at least a portion of the cooling requirements of the chain of modular data pods. Adjacent common fluid and electrical circuit sections form a common fluid and electrical circuit that connects to the central cooling system.

U.S. Pat. No. 8,446,710 for system and method for structural, modular power distribution in a modular data center by inventors Schmitt, et al., filed Feb. 7, 2011 and issued May 21, 2013, is directed to a system and method for structural power distribution in a modular data center. In particular, the application describes a modular data center with a modular structural frame. The modular structural frame defines an enclosure, and a plurality of information handling systems may be located in the enclosure. The modular data center may also include a power distribution pathway that is at least partially disposed within the modular structural frame of the modular data center. The modular data center may also include a plurality of power distribution elements disposed within the power distribution pathway, which power the information handling systems located in the enclosure.

U.S. Pat. No. 8,547,710 for electromagnetically shielded power module by inventors Ruehl, et al., filed Jan. 11, 2011 and issued Oct. 1, 2013, is directed to an electromagnetically shielded power module and data center including such a module. In one example, the electromagnetically shielded power module includes an electromagnetically shielded enclosure including a shell and at least one door, the enclosure surrounding and providing electromagnetic shielding for an interior volume. The electromagnetically shielded power module also includes a power delivery control module positioned within the interior volume and configured to monitor filtered power received into the interior volume of the electromagnetically shielded enclosure. The electromagnetically shielded power module further includes a plurality of power distribution units positioned within the interior volume and configured to receive filtered power from the power delivery control module and route power to one or more computing systems. The electromagnetically shielded power module also includes a stored energy system positioned within the interior volume and configured to deliver energy to the power distribution unit upon detection of an interruption of filtered power to the power delivery control module.

U.S. Pat. No. 8,601,827 for space-saving high-density modular data pod systems and energy-efficient cooling systems by inventors Keisling, et al., filed Oct. 29, 2012 and issued Dec. 10, 2013, is directed to a space-saving, high-density modular data pod system and an energy-efficient cooling system. The modular data pod system includes a central free-cooling system and a plurality of modular data pods, each of which includes a heat exchange assembly coupled to the central free-cooling system, and a distributed mechanical cooling system coupled to the heat exchange assembly. The modular data pods include a data enclosure having at least five walls arranged in the shape of a polygon, a plurality of computer racks arranged in a circular or U-shaped pattern, and a cover to create hot and cold aisles, and an air circulator configured to continuously circulate air between the hot and cold aisles. Each modular data pod also includes an auxiliary enclosure containing a common fluid and electrical circuit section that is configured to connect to adjacent common fluid and electrical circuit sections to form a common fluid and electrical circuit that connects to the central free-cooling system. The auxiliary enclosure contains at least a portion of the distributed mechanical cooling system, which is configured to trim the cooling performed by the central free-cooling system.

U.S. Pat. No. 8,624,433 for data center uninterruptible power distribution architecture by inventors Whitted, et al., filed Apr. 29, 2009 and issued Jan. 7, 2014, is directed to an apparatus and associated method and computer program products involving a highly efficient uninterruptible power distribution architecture to support modular processing units. As an illustrative example, a modular processing unit includes a corresponding uninterruptible power system in which only one AC-to-DC rectification occurs between the utility AC grid and the processing circuit (e.g., microprocessor) loads. In an illustrative data center facility, a power distribution architecture includes a modular array of rack-mountable processing units, each of which has processing circuitry to handle network-related processing tasks. Associated with each modular processing unit is an uninterruptible power supply (UPS) to supply operating power to the network processing circuitry. Each UPS includes a battery selectively connectable across a DC bus, and an AC-to-DC rectifier that converts an AC input voltage to a single output voltage on the DC bus. The regulated DC bus voltage may be close to the battery's fully charged voltage.

U.S. Pat. No. 8,638,008 for 380 volt direct current power distribution system for information and communication technology systems and facilities by inventors Baldwin, et al., filed Dec. 22, 2010 and issued Jan. 28, 2014, is directed to a method and a modular direct current power distribution system. A distribution panel may receive alternating current power with a voltage range between 200 volts and 15000 volts. A modular rectifier may convert the alternating current power from the distribution panel to direct current power with a range of 250 volts to 600 volts. An end feed box may receive alternative energy power from an alternative energy power source. A power pathway module may distribute the direct current power from the modular rectifier to a set of information and communication technology equipment. An electrical protection system may guard against electrical damage.

U.S. Pat. No. 8,743,543 for modular computing environments by inventors Clidaras, et al., filed Jul. 9, 2012 and issued Jun. 3, 2014, is directed to a computer system that may include a connecting hub having a plurality of docking regions and be configured to provide to each docking region electrical power, a data network interface, a cooling fluid supply and a cooling fluid return; and a plurality of shipping containers that each enclose a modular computing environment that incrementally adds computing power to the system. Each shipping container may include a) a plurality of processing units coupled to the data network interface, each of which include a microprocessor; b) a heat exchanger configured to remove heat generated by the plurality of processing units by circulating cooling fluid from the supply through the heat exchanger and discharging it into the return; and c) docking members configured to releaseably couple to the connecting hub at one of the docking regions to receive electrical power, connect to the data network interface, and receive and discharge cooling fluid.

U.S. Pat. No. 8,781,637 for safe exposed conductor power distribution system by inventor Eaves, filed Dec. 7, 2012 and issued Jul. 15, 2014, is directed to a power distribution system (that can detect an unsafe fault condition where an individual or object has come in contact with the power conductors) regulates the transfer of energy from a source to a load. Periodically, the source controller opens an S1 disconnect switch, a and load controller opens an S2 disconnect switch. A capacitor represents the capacitance across the load terminals. If the capacitor discharges at a rate higher or lower than predetermined values after the S1 and S2 disconnect switches are opened, then a fault condition is registered, and the S1 and S2 switches will not be commanded to return to a closed position, thus isolating the fault from both the source and the load.

U.S. Pat. No. 9,184,795 for packet energy transfer in-line communications by inventor Eaves, filed Jan. 26, 2015 and issued Nov. 10, 2015, is directed to data communicated between a digital power transmitter and one or more digital power receivers over a transmission line comprising positive and negative conductors. If the transmitter is sending data to the receiver, a first transmitter electrical switch is selectively operated to increase electrical charge in the transmission-line capacitance. If the receiver is sending data to the transmitter, a first receiver electrical switch is selectively operated to increase electrical charge in the transmission-line capacitance.

U.S. Pat. No. 9,186,378 for system and method for low speed control of polyphase AC machine by inventors Reichard, et al., is directed to a method of starting a wind turbine generator of any type of polyphase AC machine, including, but not limited to, brushless DC or permanent magnet machines is disclosed. The machine starts from a dead stop or from low speed operation and is accelerated to the cut in speed for power production. The start-up is realized utilizing the common set of electrical conductors and the power converter also used for capturing the generated power. Under initial operation, the power converter executes a PWM modulation technique to drive the machine. Periodically, the PWM modulation is stopped to read the electrical position of the generator.

U.S. Pat. No. 9,282,684 for cooling systems for electrical equipment by inventors Keisling, et al., filed Aug. 28, 2012 and issued Mar. 8, 2016, is directed to a space-saving, high-density modular data center and an energy-efficient cooling system for a modular data center. The modular data center includes a first cooling circuit including a primary cooling device and a plurality of modular data pods. Each modular data pod includes a plurality of servers, a heat exchange member coupled to the first cooling circuit and a second cooling circuit coupled to the heat exchange member and configured to cool the plurality of servers, the second cooling circuit including a secondary cooling device configured to cool fluid flowing through the second cooling circuit. Each modular data pod also includes an auxiliary enclosure containing at least a portion of a distributed mechanical cooling system, which is configured to trim the cooling performed by a central free-cooling system.

U.S. Pat. No. 9,419,436 for digital power receiver system by inventors Eaves, et al., filed Oct. 19, 2015 and issued Aug. 16, 2016, is directed to digital power regulated by transmitting digital power via a transmission line pair to at least one receiver circuit in a digital power receiving system. The digital power is converted into analog power in the receiver circuit. The analog power is transmitted to at least one power conditioning circuit, and output power is transmitted from the power conditioning circuit. At least one voltage in the digital power receiver system is monitored; and, in response to that monitoring, the output power from the power conditioning circuit is regulated to improve at least one of safety, efficiency, resiliency, control, and routing of power.

U.S. Pat. No. 9,577,242 for internal header flow divider for uniform electrolyte distribution by inventor Coad, filed Feb. 18, 2014 and issued Feb. 21, 2017, is directed to header flow divider designs and methods of electrolyte distribution. Internal header flow dividers may include multiple flow channels and may be built into flow frames. Flow channels within internal header flow dividers may divide evenly multiple times in order to form multiple flow channel paths and provide a uniform distribution of electrolytes throughout electrode sheets within electrochemical cells. Furthermore, uniform electrolyte distribution across electrode sheets may not only enhance battery performance, but also prevent zinc dendrites that may be formed in electrode sheets. The prevention of zinc dendrite growth in electrode sheets may increase operating lifetime of flow batteries. The disclosed internal header flow dividers may also be included within end caps of electrochemical cells.

U.S. Patent Publication No. 20170064876 for integrated high density server vault with HVAC UPS backup by inventors Leckelt, et al., filed Aug. 31, 2016 and published Mar. 2, 2017, is directed to an Integrated High Density Server Vault (or "HDSV") system containing the necessary mechanical and electrical infrastructure for the installation, operation and cooling of heat generating data processing equipment within a scalable manufactured environment which includes, but is not limited to, computing and electrical equipment. The disclosure relates in particular to the equipment application as it pertains to units adapted for rapid deployment of computing and electrical equipment.

U.S. Pat. No. 9,590,404 for high capacity power distribution panel for a modular data center by inventors Bailey, et al., filed Feb. 2, 2016 and issued Mar. 7, 2017, is directed to a power distribution network includes a first busway, a second busway situated between the first busway and a load, a first bus plug, and a second bus plug. The first and second bus plugs are configured to span across the first busway and the second busway. The first bus plug is further configured to provide power from the first busway to the load via an exit from the first bus plug that is adjacent to the load. The second bus plug is further configured to provide power from the second busway to the load via an exit from the second bus plug that is adjacent to the first load.

U.S. Patent Publication No. 20170105310 for modular data center by inventor Chen, filed Dec. 22, 2016 and published Apr. 13, 2017, is directed to a modular data center including a plurality of first containers and a plurality of second containers. The plurality of first containers and second containers are partitioned into a plurality of functional modules respectively, the functional modules of the plurality of first containers being arranged in parallel, and the functional modules of the plurality of second containers being arranged in parallel on one side of the plurality of first containers and corresponding to the functional modules of the plurality of first containers respectively. The present disclosure combines the functional modules of the plurality of first containers and the plurality of second containers into modular data centers with different forms, capacities, and data center usability tiers, and the assembly of the plurality of first containers and second containers with standardized sizes may facilitate the transportation and reduce the time and cost of assembling and delivery of the modular data center.

U.S. Patent Publication No. 20170187188 for control method of an electric microgrid by inventors Guyon, et al., filed Dec. 14, 2016 and published Jun. 29, 2017, is directed to a method for controlling an electrical microgrid comprising a renewable power source, delivering, to the microgrid, a first power that is controlled by droop control, and capable of synchronously operating in parallel with a synchronous power source, the synchronous source being capable of generating a second power that is also delivered to the microgrid, according to a criterion for the automatic start/stop of said synchronous power source, the method comprising the starting of the synchronous source as soon as the frequency and/or the voltage of the microgrid are lower than a threshold frequency and/or a threshold voltage, respectively, and the stopping of the synchronous source as soon as the second power is lower than a threshold power.

U.S. Patent Publication No. 20170214236 for method and apparatus for parallel operation of packet energy transfer receivers by inventor Eaves, filed Jan. 23, 2017 and published Jul. 27, 2017, is directed to a digital power distribution system comprising a digital power transmitter configured to accept analog electrical power and to convert the analog electrical power into discrete energy packets for distribution across a common set of transmission lines; a plurality of digital power receivers with parallel connections to the transmission lines, wherein the digital power receivers are configured to accept the energy packets from the digital power transmitter and to convert the packets back into analog electrical power for use by the load device; a load device electrically coupled with at least one of the digital power receivers and configured to receive analog electrical power from the digital power receiver with which it is electrically coupled; and a termination module with parallel connections to the transmission lines, wherein the termination module includes at least a capacitor configured to establish the characteristic capacitance of the transmission lines.

U.S. Patent Publication No. 20170229886 for digital electricity transmission system using reversal sensing packet energy transfer by inventor Eaves, filed Feb. 7, 2017 and published Aug. 10, 2017, is directed to a power distribution system configured to detect unsafe conditions that include electrically conducting foreign objects or individuals that have come in contact with exposed conductors in the power distribution system. A responsive signal is generated in a source controller including source terminals. The responsive signal reverses a voltage on the source terminals. With the voltage on the source terminals reversed, a measurement of electrical current flowing through the source terminals is acquired; and the source controller generates signals to electrically disconnect the source from the source terminals if and when the electrical current falls outside of high or low limits indicating that there is a conducting foreign object or living organism making electrical contact with the source or load terminals or a failure in power distribution system hardware.

U.S. Pat. No. 9,763,366 for space-saving high-density modular data systems and energy-efficient cooling systems by inventors Keisling, et al., filed Dec. 28, 2011 and issued Sep. 12, 2017, is directed to a space-saving, high-density modular data pod and a method of cooling a plurality of computer racks. The modular data pod includes an enclosure including wall members contiguously joined to one another along at least one edge of each wall member in the shape of a polygon and a data pod covering member. Computer racks arranged within the enclosure form a first volume between the inner surface of the wall members and first sides of the computer racks. A second volume is formed of second sides of the computer racks. A computer rack covering member encloses the second volume and the data pod covering member form a third volume coupling the first volume to the second volume. An air circulator continuously circulates air through the first, second, and third volumes. The method includes circulating air between the first and second volumes via the third volume and the computer racks.

U.S. Publication No. 20170269648 for air dam for a datacenter facility by inventors Ruiz, et al., filed Jun. 2, 2017 and Sep. 21, 2017, is directed to a method, apparatus, and system in which an air dam is incorporated into an air ventilation stream of a datacenter to control the temperature of an interior space of the datacenter. The datacenter may include a raised floor in which the ventilation stream is injected through perforations within the raised floor. An air dam may be positioned at an entry region of the under floor plenum to obstruct the flow of air from a supply air plenum. The air dam is used to create a positive pressure across the raised floor at a substantially constant pressure distribution.

U.S. Pat. No. 9,800,051 for method and apparatus for controlling energy flow between dissimilar energy storage devices by inventors Laubenstein, et al., filed Sep. 3, 2015 and issued Oct. 24, 2017, is directed to an energy storage system that utilizes batteries of multiple compositions and provides improved load sharing between the different types of batteries. The energy storage system includes at least two batteries, where each battery has a different chemical composition for storing energy. One battery is configured for rapid charging/discharging and the other batter is configured for slower charging/discharging. Each battery is connected to a common connection via an energy regulator. The regulators are initially configured such that the energy regulator connected between the common connection and the battery configured for rapid charging/discharging responds initially to changes in power demand at the common connection. If power demand continues, the first regulator decreases the amount of energy transferred between the first battery and the common connection while the second regulator begins transferring energy between the second battery and the common connection.

U.S. Publication No. 20170359917 for modular data center with utility module by inventors Bailey, et al., filed Jun. 14, 2016 and published Dec. 14, 2017, is directed to a data center that may be organized into modules, wherein the modules are purchased pre-configured to provide certain functionality of an information handling system. The modules may include utility modules, information technology (IT) modules, and air handling unit (AHU) modules. The utility module may provide infrastructure for other modules, such as electrical power service infrastructure. Electrical power may be provided by the utility module to other modules through two or more redundant busses connected to different electrical sources. The utility module may also include a control system that allows the utility services to be reconfigured to allow installation of new modules without interrupting service to existing modules.

U.S. Publication No. 20170359922 for modular data center with passively-cooled utility module by inventors Bailey, et al., filed Jun. 14, 2016 and published Dec. 14, 2017, is directed to a data center that may be organized into modules, wherein the modules are purchased pre-configured to provide certain functionality of an information handling system. The modules may include utility modules, information technology (IT) modules, and air handling unit (AHU) modules. The utility module may provide infrastructure for other modules, such as electrical power service infrastructure. The utility module may be passively cooled through openings to controlled environments in other modules. For example, the utility module may include openings for airflow to and from the warm air aisle and the cool air aisle of an information technology (IT) module that has an attached air handing unit (AHU) module. Space in the utility module may be cooled through airflow to and from the cooled IT module.

U.S. Pat. No. 9,853,689 for packet energy transfer power control elements by inventor Eaves, filed Nov. 5, 2015 and issued Dec. 26, 2017, is directed to a digital power receiver electrically coupled with a power control element to receive electrical current therefrom. The power control element includes (i) a power conditioning circuit electrically coupled with an electrical power source and (ii) element controller circuitry electrically coupled with the power conditioning circuit. The element controller circuitry is configured to control and receive feedback from the power conditioning circuit, to receive a communication/synchronization signal, and to output digital power under packet energy transfer protocol.

SUMMARY OF THE INVENTION

The present invention relates to data centers, and more specifically to modular data centers.

It is an object of this invention to provide modular data centers that are expandable, scalable, and easily deployed. Further, the invention provides for efficient use of energy within the modular data center.

These and other aspects of the present invention will become apparent to those skilled in the art after a reading of the following description of the preferred embodiment when considered with the drawings, as they support the claimed invention.

BRIEF DESCRIPTION OF THE DRAWINGS

FIG. 7A illustrates a map of North America and Central America showing a percentage of the year that full free cooling is achieved.

FIG. 7B is a table free cooling for selected cities in North America and Central America.

DETAILED DESCRIPTION

Figure 1:
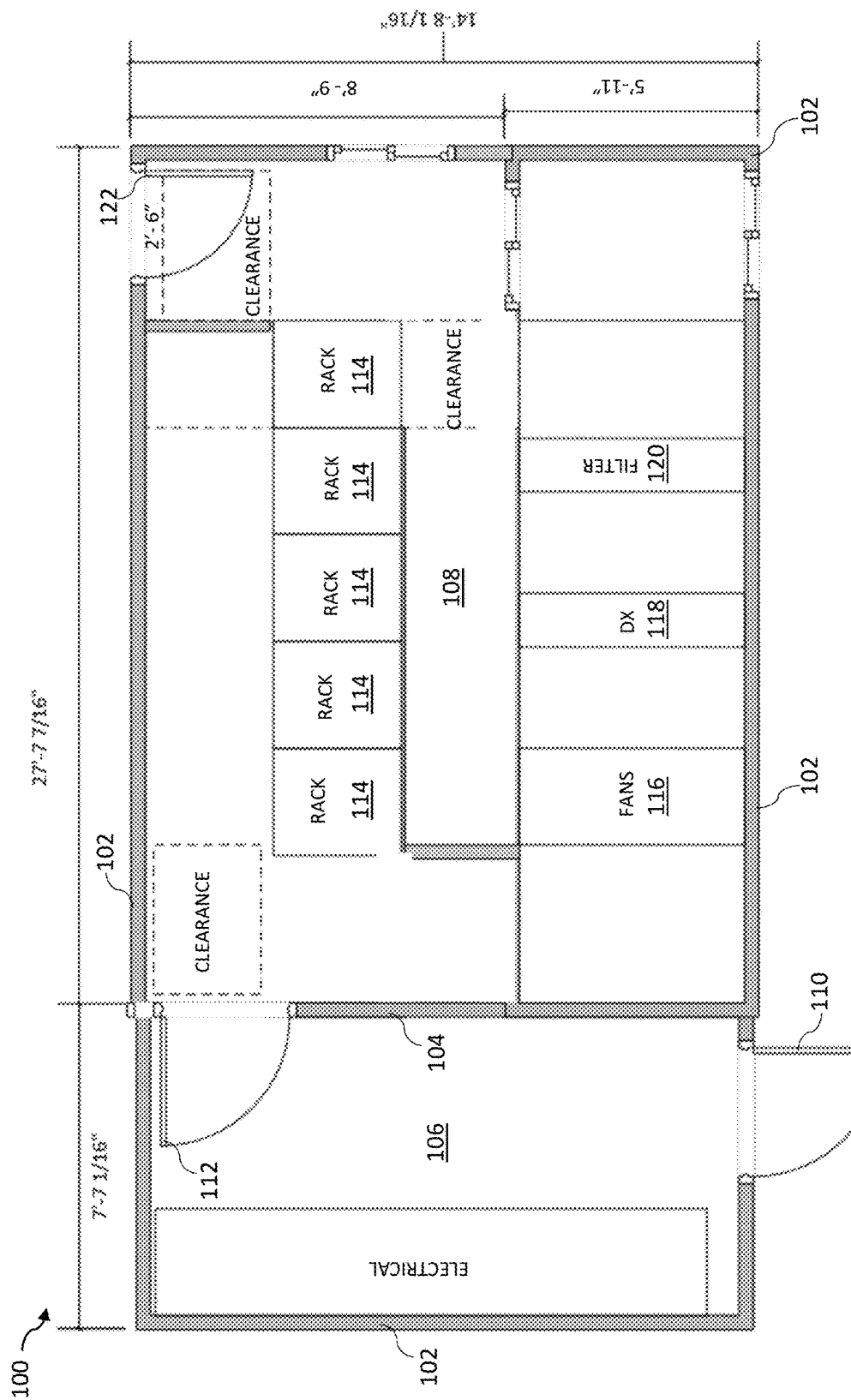
FIG. 1 illustrates one example of a modular data center.

The present invention is generally directed to data centers, and more specifically to modular data centers.

Referring now to the drawings in general, the illustrations are for the purpose of describing one or more preferred embodiments of the invention and are not intended to limit the invention thereto.

Modular data centers provide significant advantages over traditional data centers, including faster deployment, expandability, scalability, relocatability, reusability, simplified maintenance, and lower cost. Examples of data centers include U.S. Pat. Nos. 8,514,572, 9,069,534, 9,347,233, 9,648,787, 9,717,165, and 9,723,761, U.S. Publication Nos. 20130062047 and 20160302324, and WIPO Publication Nos. WO2010139919, WO2010139921, WO2011073668, WO2011148175, WO2013021182, WO2016042138, WO2016193152, WO2016193153, WO2016207321, WO2016207323, WO2017129448, each of which is incorporated herein by reference in its entirety.

The modular data center preferably includes at least one rack room. Data centers include networked computer servers and telecommunications equipment (e.g., routers) in racks. In one embodiment, the at least one rack room includes a floor and at least one rack storage area on the floor. Each of the at least one rack storage area is operable to hold at least one rack operable to house at least one rack-mountable electronic component. In one embodiment, the at least one rack is pre-installed in the modular data center. Alternatively, the modular data center is provided without the at least one rack. In another embodiment, the at least one rack storage area includes fixings to correctly position the at least one rack. In one embodiment, the at least one rack stands on the floor.

The modular data center preferably includes at least one air circulation system. The at least one air circulation system preferably includes at least one fan. In one embodiment, the at least one fan is operable to generate an air flow of at least 0.5 m$^3$/s. In preferred embodiment, the at least one fan is operable to generate an air flow of at least 1 m$^3$/s, and more preferably at least 5 m$^3$/s. The at least one air circulation system preferably includes at least one air supply duct to transport cooled air to the at least one rack.

In one embodiment, the at least one air circulation system is configured to provide air circulation under controlled pressure. In another embodiment, the at least one air circulation system utilizes an air circulation control unit for providing air circulation under controlled pressure. In yet another embodiment, the at least one air circulation system includes at least one pressure sensor to measure pressure in the modular data center. In one embodiment, an area of controlled pressure is accessible through an airlock room with an entry door and an exit door. A control unit preferably prevents the entry door from being open at the same time as the exit door during normal operation.

In one embodiment, the at least one rack room includes at least one cold aisle and/or at least one warm aisle. The at least one cold aisle is upstream of a rack storage area in the direction of flow of cooling air. The at least one warm aisle is downstream of a rack storage area in the direction of flow of heated air from information technology (IT) components in the at least one rack. In one embodiment, the at least one cold aisle is positioned adjacent to at least one rack storage area. The at least one cold aisle is preferably cooled using cooled air through the at least one air circulation system. In another embodiment, the at least one warm aisle is positioned adjacent to at least one rack storage area. In yet another embodiment, the at least one cold aisle and/or the at least one warm aisle are positioned between two adjacent rack storage areas. In one embodiment, the at least one cold aisle and/or the at least one warm aisle are parallel to at least one rack storage area.

In another embodiment, the modular data center uses an adiabatic cooling system to cool the modular data center. The adiabatic cooling system utilizes both evaporative cooling and air cooling. In a preferred embodiment, the adiabatic cooling system utilizes dry air cooling without water when the ambient air is below a threshold temperature and a combination of air cooling and evaporative cooling when the ambient air is above the threshold temperature. Advantageously, the adiabatic cooling system allows the data center to use less water and energy than a traditional cooling system. Adiabatic cooling also provides enhanced modes of survivability during a loss of primary power. The adiabatic cooling system exchanges heat energy via latent exchange to cool without the application of mechanical refrigerant-based systems. Additionally, or alternatively, the modular data center uses at least one refrigerant-based cooling system.

In one embodiment, the modular data center includes a fire detection and suppression system. In one embodiment, the fire detection and suppression system includes a control system for closing at least one air exhaust. In another embodiment, the fire detection and suppression system re-circulates cooled air within the building. In yet another embodiment, the fire detection and suppression system includes a clean agent (e.g., gas) for fire suppression. Alternatively, the fire detection and suppression system includes an aqueous agent (e.g., water) for fire suppression. In one embodiment, the aqueous agent is a water mist.

Data centers are often required to be continuously operational for long periods of time. To ensure that the data center is operational, the data center preferably has redundant systems and/or components. In one embodiment, the redundant components include power systems, network connectivity, fire detection and suppression systems, generator backup systems, uninterruptable power supply (UPS) backup systems, detection and monitoring systems (e.g., temperature, humidity, moisture, airflow, voltage, power, smoke, security), and lightning protection. Advantageously, the redundant systems and/or components eliminate single points of failure. In one embodiment, the redundant systems and/or components are N+1 (i.e., parallel redundancy), N+2, N+3, 2N, and/or 2(N+1).

In another embodiment, an electrical arrangement of circuits supplied with high voltage direct current (DC) (above 55 Volts) is arranged in a star topology starting at the main electrical bus level of the data center. In a preferred embodiment, each circuit utilizes an N+1 arrangement. In yet another embodiment, multiple N+1 circuits are supplied from at least one independent source on at least one independent pathway to each rack or cabinet location. Power is delivered to each rack or cabinet location in the data center space where it is converted to a necessary utilization voltage. Examples of the necessary utilization voltage include, but are not limited to, nominal 54 VDC, 120 VAC at 50 Hz, 120 VAC at 60 Hz, 240 VAC at 50 Hz, 240 VAC at 60 Hz, 120/208 VAC Multiphase at 50 Hz, 120/208 VAC Multiphase at 60 Hz, 336 VDC, or 380 VDC.

The air circulating system is preferably designed in such a manner that any one component can be serviced for regular maintenance activities or emergency repairs without removal of cooling from the equipment housed in the data center during the regular maintenance activities or the emergency repairs. In a preferred embodiment, each component has redundant electrical supplies (i.e., dual electrical supplies) from the main facility source down to the component level such that each of the redundant electrical supplies is operable to provide full system capacity. The air circulating system preferably has no degradation of service based on the pathway selected for the electrical supply. In a preferred embodiment, transfer between the pathways is automatic and does not require manual intervention. In one embodiment, the control system operating the air flow, cooling, conditioning, and maintenance of air psychrometric conditions and filtration is fully redundant with independent systems such that failure of any one component does not inhibit the facility's ability to properly serve the equipment housed in the data center. Separate and isolated controllers and programs are preferably used to eliminate the possibility of any program changes affecting overall system availability.

In a preferred embodiment, the facility is preferably physically arranged with at least one security zone. The at least one security zone restricts personnel to areas within their responsibility. In another embodiment, the facility includes at least one door, at least one partition, at least one cage, and/or at least one gate to limit human access to the at least one security zone. In one embodiment, the at least one security zone is accessed using at least one RFID card, at least one biometric scanner (e.g., fingerprint scanner, facial identification, voice authentication, retinal scanner, iris scanner, vein scanner), and/or at least one lock and key. In another embodiment, the at least one security zone includes at least one closed-circuit television (CCTV) system.

The modular data center is preferably factory built. In one embodiment, the modular data center is fully assembled and delivered in a single volumetric space with floors, walls, and roof components fully created. The single volumetric approach allows for rapid field deployment but is subject to limitations in shipping due to height restrictions along transport pathways. Thus, this embodiment provides facilities with a limited ceiling height.

In another embodiment, the unit is delivered in factory-created modules for rapid assembly onsite with a combination of ceilings, walls, and floors created as field assembly components. In one embodiment, the facility is constructed in a factory utilizing a chassis ceiling system containing all infrastructure components. Wall components are preferably pre-packaged in install kits. In one embodiment, at least one floor is formed of poured concrete at the project site. Alternatively, the at least one floors is formed of factory assembled components. These components are then rapidly assembled onsite in single or multi-story structures.

Advantageously, this creates a weather tight facility within days of component arrival onsite. The modular assembly approach allows for lower cost transport to the destination. This chassis delivery process also eliminates any height restrictions to the final facility. Utilizing this methodology also allows for a reduction in the structural element sizing criteria as well as the elimination of multiple adjacent structural elements in the field. For example, columns at corner locations do not need to be doubled at adjacent interfaces and beams at floor to ceiling interfaces do not need to be doubled.

Further, either delivery methodology (i.e., factory created modules, single volumetric space), or a combination of both provides a more consistent and uniform product with all labor, work, and materials controlled inside a factory structure. Either method of delivery eliminates all weather conditions, site variables, and other uncontrolled limitations from the construction process. Skilled and trained workers and dedicated quality control processes are applied in the factory to transform a building from a unique assembly into a product solution. Either delivery methodology allows for the design and delivery of a facility in a rapid and repeatable process and eliminates the re-engineering of unique structures that is utilized in traditional construction processes. This reduces the cost of construction and rapidly increases the timeline to delivery.

In one embodiment, the modular data center is formed of modules that are operable to be transported on tractor trailers from a factory or storage facility to the location of the data center. In another embodiment, the modules are operable to be transferred on and off of a tractor trailer using a crane and/or a forklift. In yet another embodiment, the facility is intended to be operated for a limited time period at a first location and then physically moved to a second location for use again. In still another embodiment, the facility is used as a disaster recovery component to rapidly replace infrastructure that was destroyed or rendered non-operational due to an unplanned event (e.g., natural disaster, equipment failure).

Additionally, all systems should maximize their survivability of services to the supported information technology equipment housed within. The systems are preferably self-healing and built for unattended operation because sites are often deployed at remote locations away from direct human intervention.

A feature of the present invention is that the sites deployed are all fully monitored for remote visibility, troubleshooting, and remote operation. All operational data from mechanical, electrical, security, and fire systems is presented in a common data aggregation system for alarm condition status, real-time operational intelligence, and historical analysis. All data points in the system are archived in a database. In a preferred embodiment, the data points in the system are archived in intervals with a duration of less than 1 minute. Archived data points are preferably stored in the database for the duration of the owner's needs. In one embodiment, the system polls all discrete devices for information at a minimum of 1-second resolution. On each poll cycle, the system preferably analyzes the data against a common alarm framework, reports alarm conditions that occur, and archives the data into a database across the interval (e.g., 1-minute interval). Polling data obtained during the interval is stored by a variety of available means, selectable on each data point. In a preferred embodiment, the polling data includes a minimum value, a maximum value, a last change in state, a first change in state, and/or an average value. All data points are preferably available for further historical analysis for purposes such as event resolution, failure mode analysis, capacity planning, energy utilization, predictive analysis, or other advanced analytical methods. In a preferred embodiment, the data is stored in a common format across all available reporting devices regardless of manufacturer, make, model, equipment purpose, or functionality. Any data point in the system can be used, analyzed, or combined with any other data point for these or other evaluation purposes.

The efficiency of a data center is measured by a ratio known as power usage effectiveness (PUE) that measures how much energy is used by computing equipment relative to the total facility energy. The total facility energy includes the energy used by the computing equipment, as well as energy used for infrastructure (e.g., lighting, cooling, power equipment, security, humidification, ventilation, water). An ideal PUE is 1.0 (i.e., all of the energy is used to power the computing equipment). PUE is defined in International Organization for Standardization document number ISO/IEC 30134-2:2016, published April 2016, which is incorporated herein by reference in its entirety.

FIG. 1 illustrates one example of a modular data center. The example shown in FIG. 1 is a modular data center 100 in a small, high density configuration. The modular data center 100 is rectangular with external walls 102. The modular data center 100 includes an internal wall 104 separating an electrical room 106 and a rack room 108. The electrical room 106 houses electrical equipment. The electrical room 106 houses components for a microgrid (e.g., DC microgrid) including, but not limited to, modules, busway, switches, circuit breakers, batteries, and/or power electronics. The electrical room 106 is accessible from the outside via a first exterior door 110. The electrical room 106 is connected to the rack room 108 via an interior door 112.

The rack room 108 includes at least one cabinet 114 (e.g., five cabinets 114) with electrical loads of up to 50 kW per cabinet. The modular data center 100 further includes at least one fan 116 to circulate air, a direct expansion air conditioning (DX) system 118, and/or at least one air filter 120. The rack room 108 is accessible from the outside via a second exterior door 122.

The modular data center preferably utilizes a site microgrid. The site microgrid preferably utilizes a partitioned high voltage DC bus. In one embodiment, the partitioned high voltage DC bus operates between 300 VDC and 900 VDC. This arrangement transforms a traditional series arranged electrical distribution system into a parallel arranged electrical distribution system. Advantageously, this arrangement offers additional redundancy and availability of electrical service to the end equipment without the need for complex synchronization equipment required in alternating current (AC) electrical topologies. The topology and utilization of DC voltage offers lower cost, reduced complexity, and reduced component count. Modules are preferably connected to the partitioned high voltage DC bus in a manner that they can be added or removed without interruption to power delivery to the end equipment. Redundancy and capacity arrangements are not fixed at the time of installation and may be changed throughout the lifecycle of the facility. In one embodiment, module types include utility power interfaces capable of bi-directional power flow; modules for connection of at least one mechanical generator unit powered by diesel, gasoline, propane, natural gas, or combinations of fuel sources; modules for connection of batteries used for storage of energy; modules for connection of renewable sources (e.g., solar cells, wind farms, fuel cells, or other similar components); modules for conversion of the variable DC bus voltage to a fixed DC voltage; and/or modules for conversion of variable DC voltage into fixed AC voltage. In one embodiment, different battery chemistry technologies are applied in unison to address different power delivery conditions (e.g., large quantity rapid discharge events, slow long discharge events). In one embodiment, the fixed DC voltage includes-54 VDC, 336 VDC, and/or 380 VDC. In one embodiment, the fixed AC voltage includes 120 VAC at 50 Hz, 120 VAC at 60 Hz, 240 VAC at 50 Hz, 240 VAC at 60 Hz, 120/208 VAC multiphase at 50 Hz, and/or 120/208 VAC multiphase at 60 Hz. In another embodiment, the module types include modules for energy sources utilizing hydrino transformation and/or modules for creation of electrical energy using magnetohydrodynamic generation.

In a preferred embodiment, the modular data center is capable of utilizing at least one solar module for backup power. In one embodiment, the modular data center utilizes an internal DC microgrid. The modular data center microgrid is preferably fully factory assembled and/or volumetrically delivered. In one example, the dimensions of the modular data center 100 are about 35 feet by about 14.5 feet.

In another embodiment, air control zones are eliminated from the facility due to the size of the installation (e.g., small installation). Advantageously, this reduction to a single zone of operation allows for a removal of at least one piece of control equipment and/or at least one louver.

The combination of the data center design and site microgrid offers modes of operation and survivability not available with traditional arrangements. During a utility failure or a failure of the primary source of power to a facility, the site microgrid automatically adjusts power delivery from the remaining available sources. This is typically in the order of renewable sources, peaking batteries, mechanical generator, then reserve batteries, with the goal of maintaining operations at the facility. During periods of mechanical failure, the microgrid is operable to send an independent signal to the control room to change over to a minimum energy use profile. This added operational model minimizes the amount of energy used for heat removal and allows the system to automatically expand its temperature and relative humidity window setpoint. In one embodiment, the energy required to operate the heat removal equipment in this emergency mode is about 10% of normal operation. This has the effect of creating a stay alive capability after a mechanical failure that is not present in other traditional arrangements. Advantageously, this embodiment can be deployed in an unmanned facility to provide an additional layer of protection. Unmanned facilities are often placed in locations that take a person many hours of travel time to physically arrive onsite, so the sites are designed to self-heal and operate without intervention. This embodiment allows interaction between power systems and heat removal systems to enhance site survivability.

Figure 2:
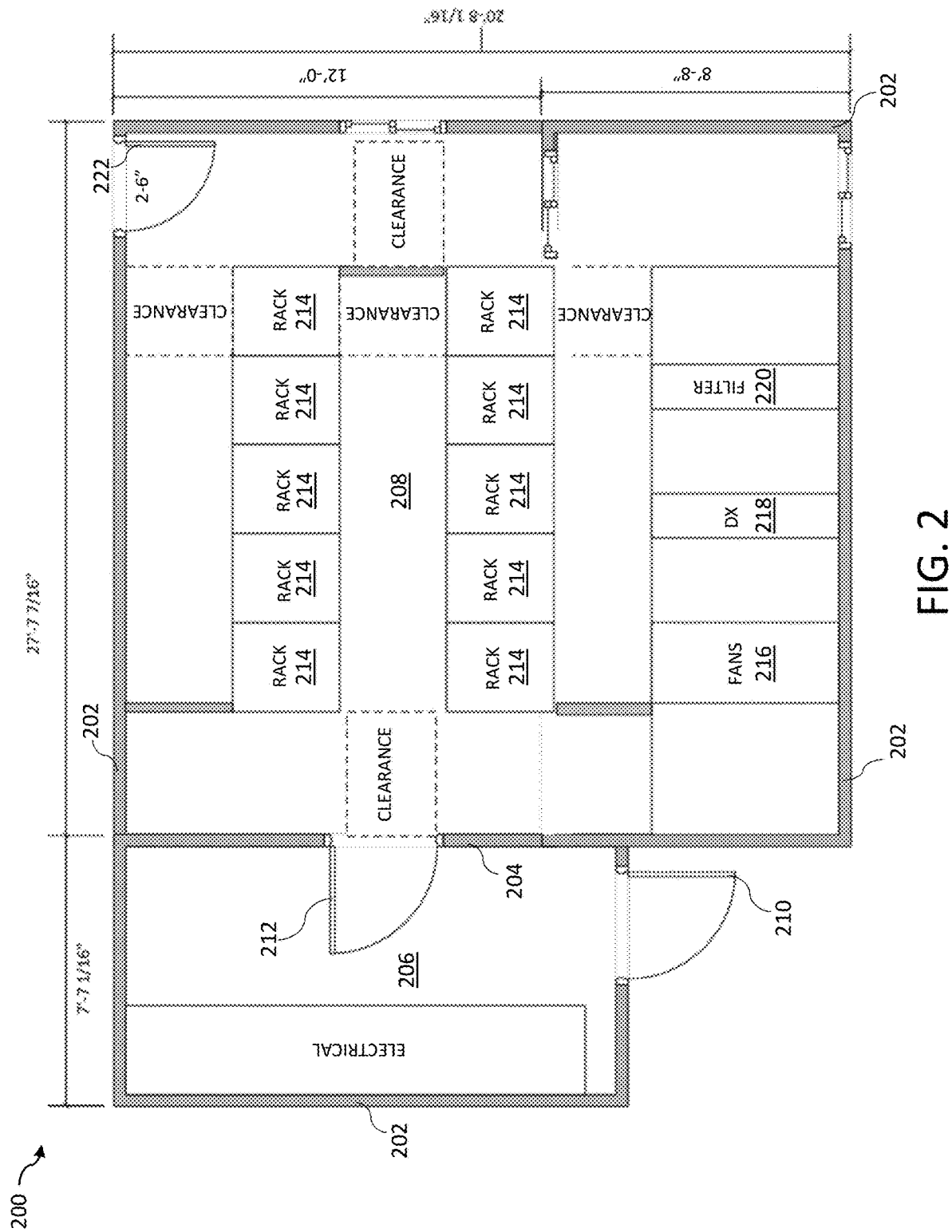
FIG. 2 illustrates another example of a modular data center.

FIG. 2 illustrates another example of a modular data center. The example shown in FIG. 2 is a modular data center 200 in a small, expandable configuration. The modular data center 200 is rectangular with external walls 202. The modular data center 200 includes an internal wall 204 separating an electrical room 206 and a rack room 208. The electrical room 206 houses electrical equipment. The electrical room 206 is accessible from the outside via a first exterior door 210. The electrical room 206 is connected to the rack room 208 via an interior door 212.

The rack room 208 includes at least one cabinet 214 (e.g., ten cabinets 214) with loads of up to 100 kW per cabinet. The modular data center 200 further includes at least one fan 216 to circulate air, a direct expansion air conditioning (DX) system 218, and/or at least one air filter 220. The rack room 208 is accessible from the outside via a second exterior door 222.

The modular data center utilizes a site microgrid. In a preferred embodiment, the modular data center is capable of utilizing at least one solar module for backup power. In one embodiment, the modular data center utilizes an internal DC microgrid. The modular data center is preferably fully factory assembled. In one example, the dimensions of the modular data center 200 are about 35 feet by about 20.5 feet.

In a preferred embodiment, the modular data center is delivered in a volumetric (3-dimensional box) methodology whereby all elements are factory assembled into their final physical arrangement. This methodology forces restrictions on the final interior clear height as shipping across highways and intermodal systems limits physical height. The physical structure in a volumetric shipping arrangement must accommodate structural elements for both the floor and ceiling systems. As a result, interior clear space is generally limited to no greater than 10'6" due to volumetric shipping requirements.

Figure 3:
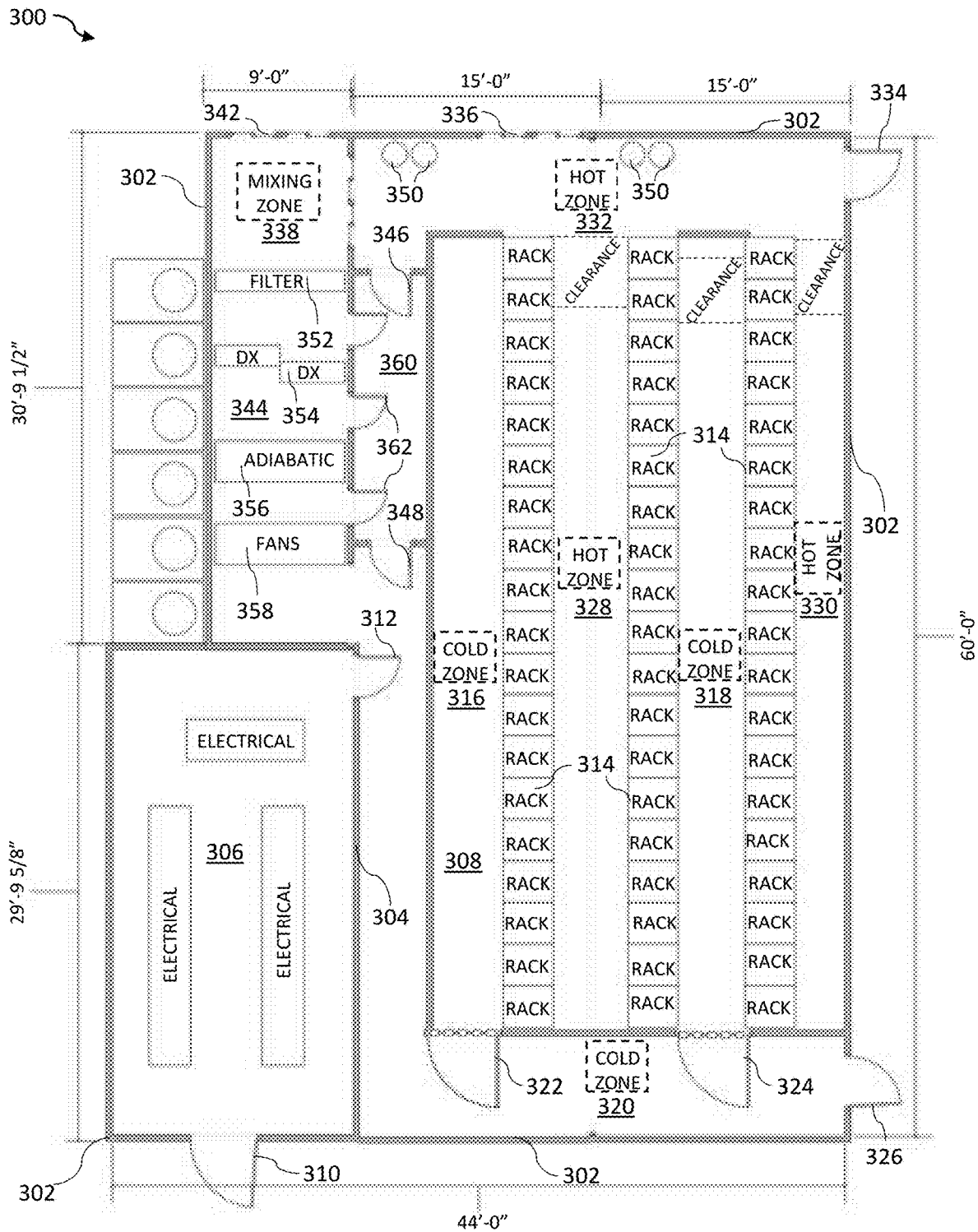
FIG. 3 illustrates yet another example of a modular data center.

FIG. 3 illustrates yet another example of a modular data center. This example employs both a volumetric delivery of the mechanical/electrical space as well as a non-volumetric delivery of the data hall space. The mechanical/electrical space does not require special height requirements and therefore can be constrained to 10'6' limitations and is delivered volumetrically. The data hall space employs a design which allows for a chassis deployment built upon columns set at the time of field assembly. This rapid design process allows for data halls with heights greater than 10'6".

A ceiling height greater than 10'6" is often necessary because multiple stacked cable tray pathways above IT equipment racks often require clearance on interior height larger than 10'6". Base interior clear space is usually 14'0" but can be accommodated easily up or down to meet end user requirements. This chassis design allows for expansion in a live mode without operational interruption. Additional modules can be added or removed over the lifecycle of the facility without interruption of reliable operation.

The example shown in FIG. 3 is a modular data center 300 in a medium, expandable configuration. The modular data center 300 has external walls 302. The modular data center 300 includes an internal wall 304 separating an electrical room 306 and a rack room 308. The electrical room 306 is accessible from the outside via a first exterior door 310. The electrical room 306 is connected to the rack room 308 via a first interior door 312.

The rack room 308 includes at least one cabinet 314 (e.g., 54 cabinets 314) with loads of up to 750 kW per cabinet. The modular data center 300 is preferably operable to include up to 200 cabinets. The rack room 308 includes a first cold aisle 316 and a second cold aisle 318. The first cold aisle 316 is connected to a cold zone 320 via a first cold interior door 322. The second cold aisle 318 is connected to the cold zone 320 via a second cold interior door 324. The cold zone 320 is accessible from the outside via a second exterior door 326. The rack room 308 includes a first warm aisle 328, a second warm aisle 330, and a hot zone 332. The hot zone 332 is accessible from the outside via a third exterior door 334. The hot zone 332 includes exhausts 336 to extract air from the modular data center 300.

In one embodiment, a mixing chamber 338 is accessible from the hot zone 332 via a mixing chamber door (not shown). Outside air enters the mixing chamber 338 via an ambient air intake 342. If the outside temperature is below a threshold temperature, the outside air is mixed with hot air exhaust from the modular data center to raise the temperature above the threshold temperature.

The modular data center utilizes a site microgrid. The site microgrid preferably utilizes a partitioned high voltage DC bus. In one embodiment, the partitioned high voltage DC bus operates between 300 and 900 VDC. This arrangement transforms a traditional series arranged electrical distribution system into a parallel arranged electrical distribution system. Advantageously, this arrangement offers additional redundancy and availability of electrical service to the end equipment without the need for complex synchronization equipment required in AC electrical topologies. The topology and utilization of DC voltage offers lower cost, reduced complexity, and reduced component count. Modules are preferably connected to the partitioned high voltage DC bus in a manner that they can be added or removed without interruption to power delivery to the end equipment. Redundancy and capacity arrangements are not fixed at the time of installation and may be changed throughout the lifecycle of the facility. In one embodiment, module types include utility power interfaces capable of bi-directional power flow; modules for connection of mechanical generator unit powered by diesel, gasoline, propane, natural gas, or combinations of fuel sources; modules for connection of batteries used for storage of energy; modules for the connection of renewable sources (e.g., solar cells, wind farms, fuel cells, or other similar components); and/or modules for conversion of the variable DC bus voltage to a fixed DC voltage; modules for conversion of variable DC voltage into fixed AC voltage. In one embodiment, different battery chemistry technologies are applied in unison to address different power delivery conditions (e.g., large quantity rapid discharge events, slow long discharge events). In one embodiment, the fixed DC voltage includes −54 VDC, 336 VDC, and/or 380 VDC. In one embodiment, the fixed AC voltage includes 120 VAC at 50 Hz, 120 VAC at 60 Hz, 240 VAC at 50 Hz, 240 VAC at 60 Hz, 120/208 VAC multiphase at 50 Hz, and/or 120/208 VAC multiphase at 60 Hz. In another embodiment, the module types include modules for energy sources utilizing hydrino transformation and/or modules for creation of electrical energy using magnetohydrodynamic generation.

In a preferred embodiment, the modular data center is operable to utilize at least one solar module for backup power. In one embodiment, the modular data center utilizes an internal DC microgrid. The modular data center is preferably fully factory assembled.

The modular data center 300 further houses an air handling plant room 344. The air handling plant room 344 includes at least one air filter 352, at least one direct expansion air conditioning (DX) system 354, at least one adiabatic cooling system 356, and at least one fan 358 to circulate air. The air plant handling room 344 is accessible from a hallway 360 via at least one air plant access door 362. The hallway 360 is accessible from the hot zone 332 via a first hallway access door 346. The hallway 360 is also accessible from the cold zone 320 via a second hallway access door 348. In one embodiment, the air plant handling room is delivered volumetrically.

The modular data center 300 preferably includes at least one tank 350 for a gaseous fire suppression system. In one example, the dimensions of the modular data center 300 are about 60 feet by about 45.5 feet. In one embodiment, the modular data center has an interior height up to 11 feet.

The modular data center is designed to simplify maintenance and reduce time to repair by allowing easy and unencumbered access to all systems. In one embodiment, the modular data system includes a gravity louver that allows disconnection and replacement of a fan component without impact to operation. In another embodiment, an individual coil of a DX system is operable to be replaced without impact to operation. In yet another embodiment, the modular data center incorporates blanking panels to allow for uninterrupted maintenance activities.

Figure 4:
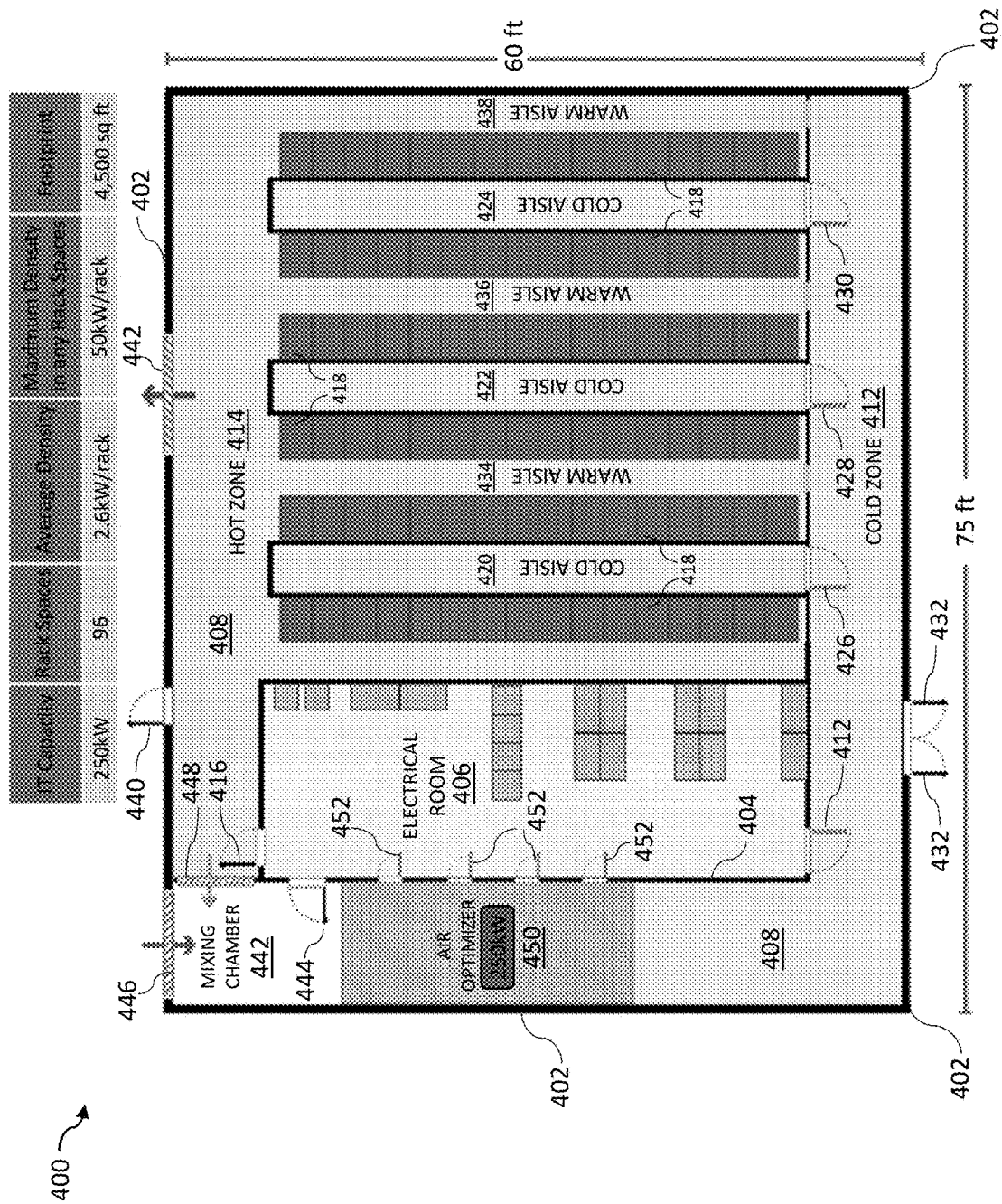
FIG. 4 illustrates still another example of a modular data center.

FIG. 4 illustrates still another example of a modular data center. This facility is delivered as a full non-volumetric design. The example shown in FIG. 4 is assembled with a chassis. The electrical and air plant room of the modular data center is delivered for internal volumetric installation in an assembled facility.

The example shown in FIG. 4 is a modular data center 400 in a large, expandable configuration. The modular data center 400 is rectangular with external walls 402. The modular data center 400 includes at least one internal wall 404 separating an electrical room 406 and a rack room 408. The electrical room 406 is connected to a cold zone 410 of the rack room 408 via a first interior door 412. The electrical room 406 is connected to a hot zone 414 of the rack room 408 via a second interior door 416.

The rack room 408 includes at least one cabinet 418 (e.g., 96 cabinets 418) with loads of up to 250 kW per cabinet. The modular data center 400 is preferably operable to include up to 200 cabinets. The rack room 408 includes a first cold aisle 420, a second cold aisle 422, and a third cold aisle 424. The first cold aisle 420 is connected to the cold zone 410 via a first cold interior door 426. The second cold aisle 422 is connected to the cold zone 410 via a second cold interior door 428. The third cold aisle 424 is connected to the cold zone 410 via a third cold interior door 430. The cold zone 410 is accessible from the outside via at least one cold exterior door 432. The rack room 408 includes a first warm aisle 434, a second warm aisle 436, and a third warm aisle 438. The hot zone 414 is accessible from the outside via at least one hot exterior door 440. The hot zone 414 includes exhausts 442 to extract air from the modular data center 400.

A mixing chamber 442 is accessible from the electrical room 406 via a mixing chamber door 444. Outside air enters the mixing chamber 442 via an ambient air intake 446. If the outside temperature is below a threshold temperature, the outside air is mixed with hot air exhaust from exhausts 448 to raise the temperature above the threshold temperature. An air optimizer 450 is connected to the electrical room 406 via at least one air optimizer door 452 (e.g., four air optimizer doors 452). The at least one air optimizer preferably utilizes adiabatic cooling.

The modular data center utilizes a site microgrid. In a preferred embodiment, the modular data center is operable to utilize at least one solar module for backup power. In one embodiment, the modular data center utilizes an internal DC microgrid. The modular data center is preferably fully factory assembled.

The modular data center further includes at least one fan to circulate air, a direct expansion air conditioning (DX) system, and/or at least one air filter. In one example, the dimensions of the modular data center are about 60 feet by about 70 feet. In one embodiment, the modular data center has an interior height up to 11 feet. In another embodiment, the modular data has an interior height up to 20 feet.

In yet another embodiment, the modular data center is multi-story. For example, two story structures with mechanical equipment on the roof. In most applications, multi-story buildings are delivered via a chassis method. Advantageously, this method has significant savings in shipping, assembly, materials, and cost. Alternatively, volumetric delivery of modules is used to deliver multi-story buildings.

In one example, the modular data center has 96 rack spaces with loads up to 250 kW. The average density is 2.6 kW/rack. The maximum density in any rack space is 50 kW/rack. The modular data center has a footprint of 4500 ft².

Figure 5:
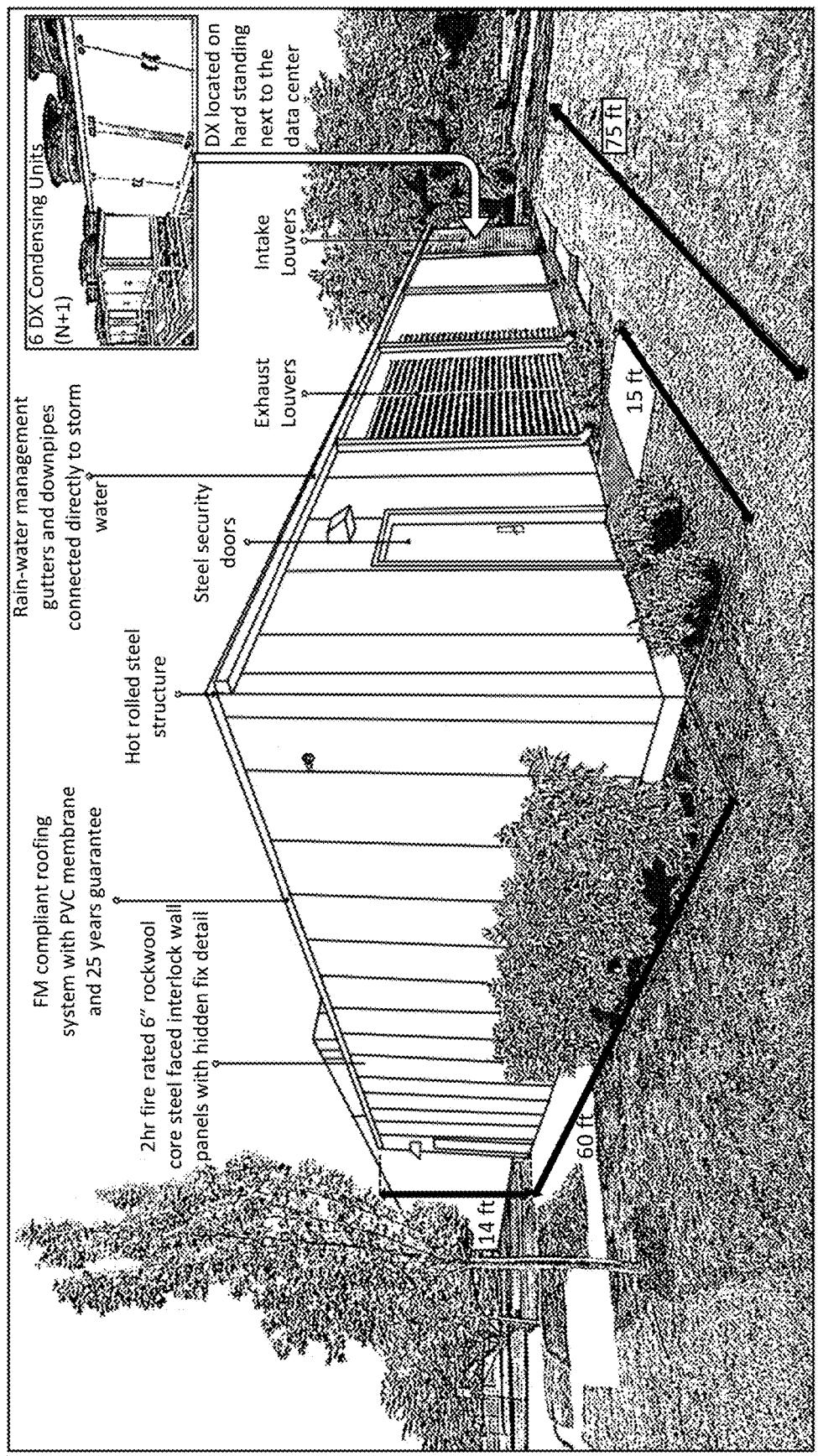
FIG. 5 illustrates an external detail of one example of a modular data center.

FIG. 5 illustrates an external detail of one example of a modular data center. The modular data center is preferably formed of steel. In one embodiment, the steel is hot rolled. The modular data center preferably includes at least one exterior door. The at least one exterior door is formed of steel in a preferred embodiment. In one embodiment, at least one exterior wall is formed from rockwool core steel faced interlocked wall panels. In another embodiment, the rockwool core steel face interlocked wall panels are about 6 inches thick. In yet another embodiment, the rockwool core steel face interlocked wall panels are 2-hour fire rated. The modular data center includes protection from external magnetic interference, RF interference, and/or x-ray penetration in one embodiment. In another embodiment, the modular data center includes additional enhancements to protect against ballistic and projectile assault.

The modular data center preferably includes a roofing system that is approved by FM Approvals. In one embodiment, the roofing system passes requirements for interior fire performance using NFPA 276, exterior fire performance using ASTM E 108, and/or wind performance using ANSI/FM 4474 for ratings starting from 60 psf up to 990 psf. NFPA 276 is detailed in National Fire Protection Association document "Standard Method of Fire Test for Determining the Heat Release Rate of Roofing Assemblies with Combustible Above-Deck Roofing Components" (2015), ASTM E 108 is detailed in American Society for Testing and Materials document "Standard Test Methods for Fire Tests of Roof Coverings" (2017), and ANSI/FM 4474 is detailed in "American National Standard for Evaluating the simulated Wind Uplift Resistance of Roof Assemblies Using Static Positive and/or Negative Differential Pressures" (January 2011). In another embodiment, the FM Approval includes hail, corrosion, and accelerated weathering performance using FM Approvals test methods for hail, corrosion, and accelerated weathering. In one embodiment, the roofing system includes a polyvinyl chloride (PVC) membrane. In another embodiment, the modular data center includes rainwater management gutters and downpipes connected directly to storm water.

In one embodiment, the roofing system incorporates at least one phase change material in a ventilated roof system. The at least one phase change material reduces the roof's peak hour thermal load by absorbing heat at the hottest part of the day and radiating the heat during cooler times. Advantageously, this reduces the facility's cooling requirements.

The modular data center preferably includes a direct expansion air conditioning (DX) system as a secondary means of heat rejection. In one embodiment, the DX system includes at least one condensing unit. In a preferred embodiment, the DX system includes (N+1) condensing units. In another embodiment, the at least one condensing unit is located on hard standing next to the modular data center.

Figure 6A:
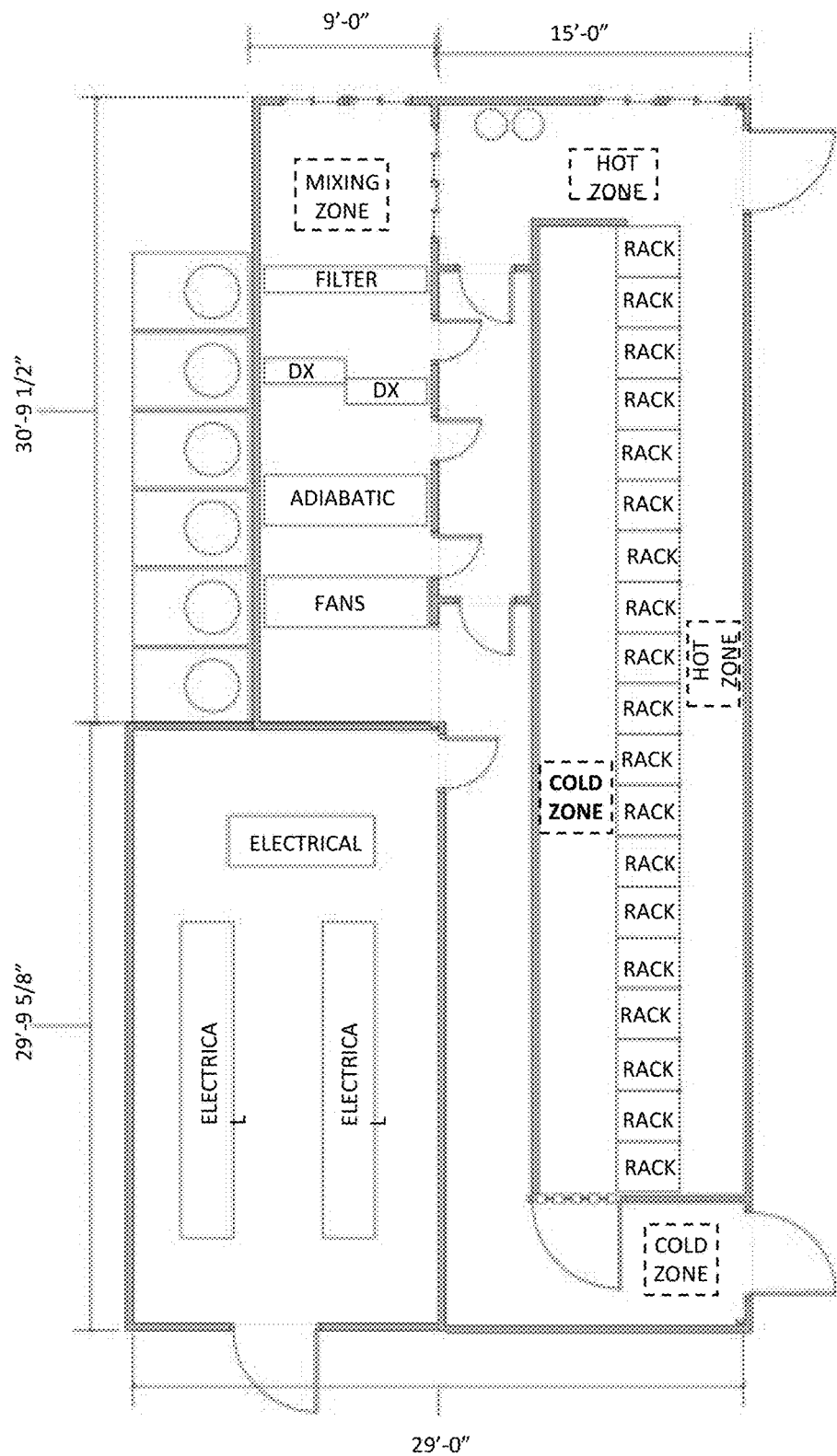
FIG. 6A illustrates an example of a modular data center before expansion.

FIG. 6A illustrates an example of a modular data center before expansion. The system is designed for live expansion such that exterior components are removed and a new module is abutted and coupled to the existing facility. All interior partitions remain in place until the expanded facility is ready for occupancy. All interior elements that may be exposed to weather conditions during assembly are factory shrink wrapped for protection until the facility is weather tight.

Figure 6B:
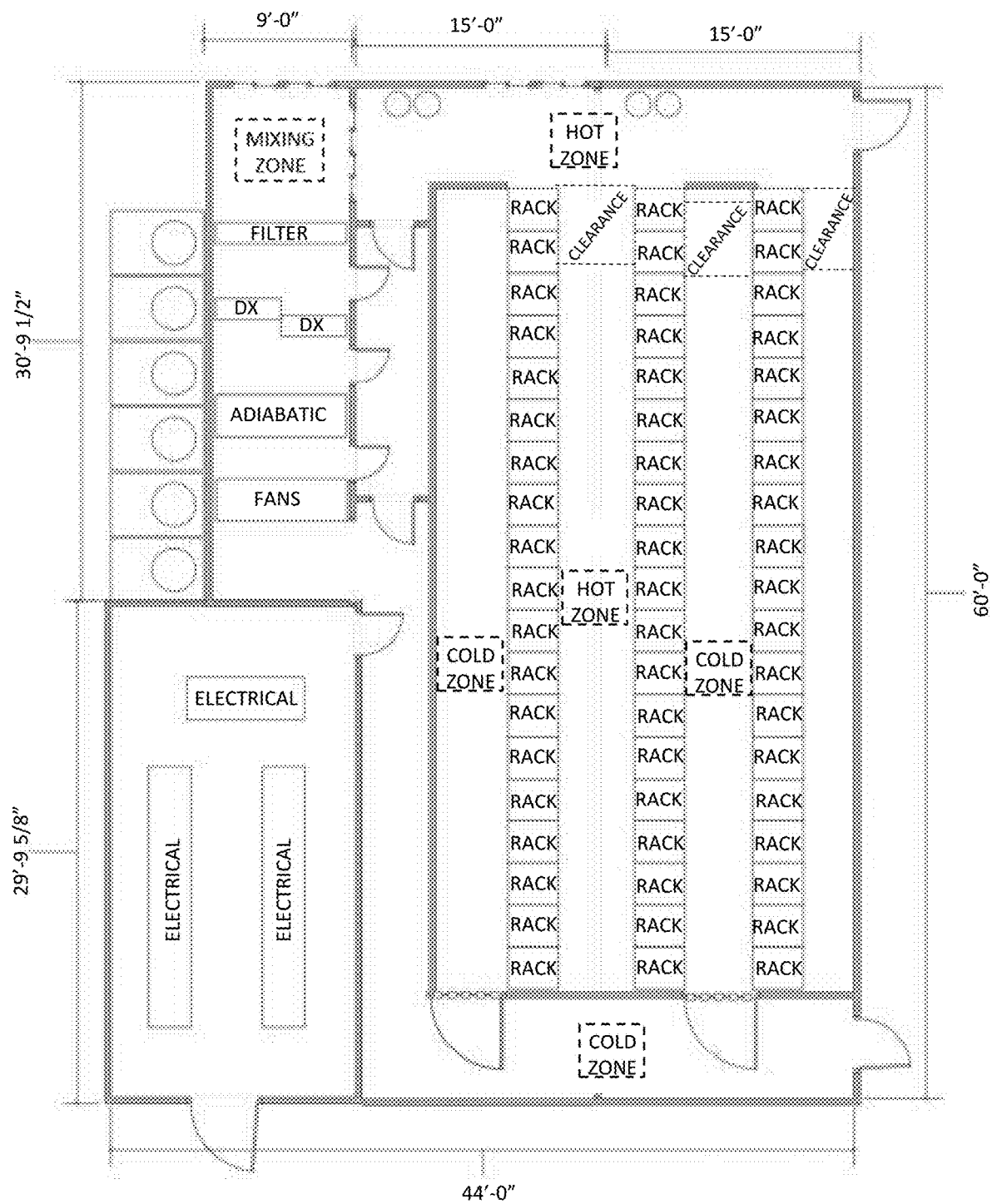
FIG. 6B illustrates an example of a modular data center after expansion.
Figure 6C:
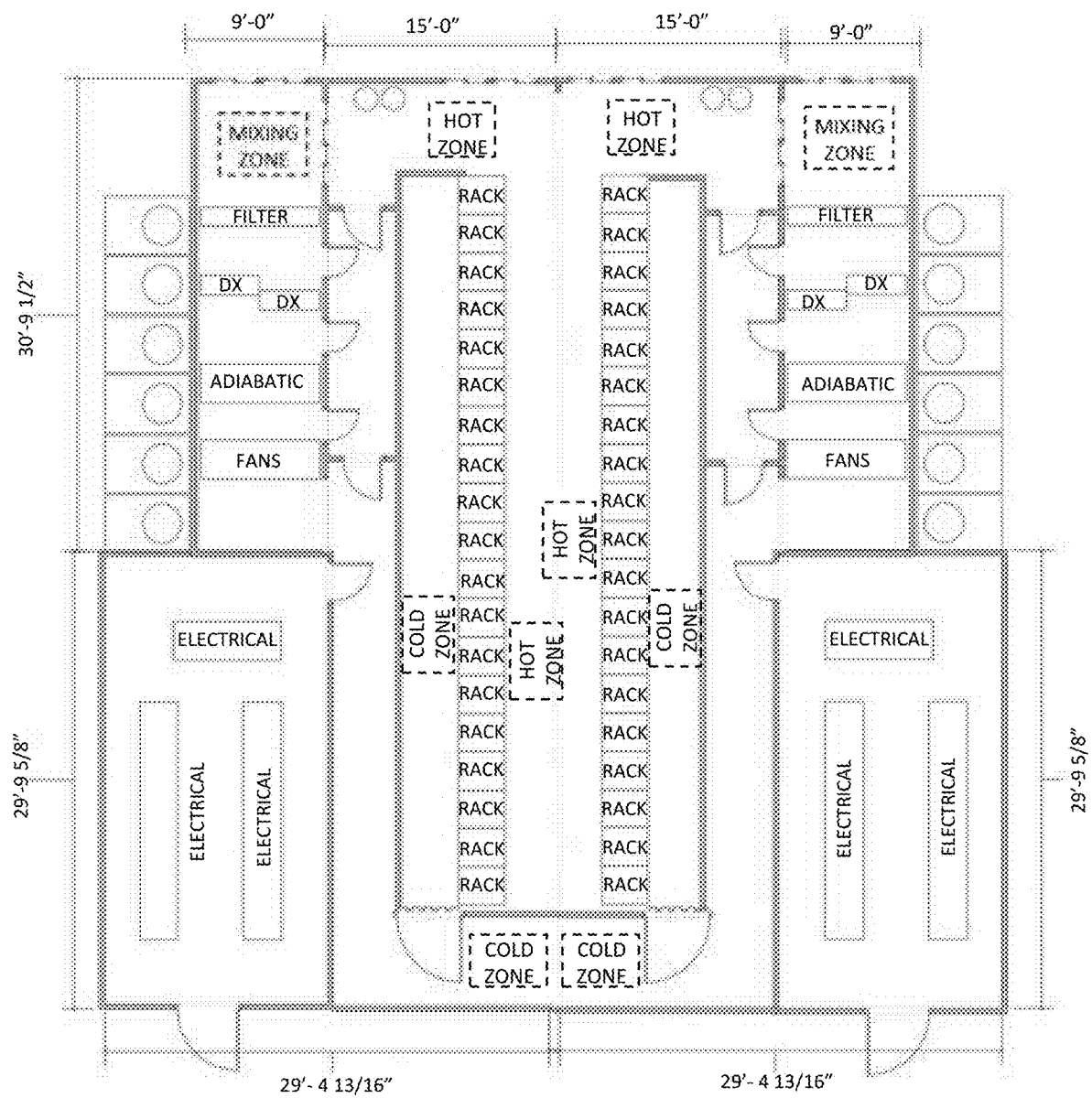
FIG. 6C illustrates another example of a modular data center after expansion.

The modular data center in FIG. 6A is about 30 feet by about 60 feet. The rack room includes 18 cabinets of approximately 30-inch width. The layout depicts 6-inch wire management between racks. In another embodiment, rack counts are increased by deploying standard 19-inch racks without wire management. FIG. 6B illustrates an example of a modular data center after expansion. After expansion, the modular data center in FIG. 6B is about 45.5 feet by about 60 feet. The rack room includes 54 cabinets after expansion. FIG. 6C illustrates another example of a modular data center after expansion. After expansion, the modular data center in FIG. 6C is about 60 feet by about 60 feet. The rack room includes 36 cabinets after expansion. Further, the modular data center in FIG. 6C includes additional components, including an additional electrical room, an additional mixing chamber, and additional fans.

As previously described, one of the main concerns with a data center is the data center's PUE, which is a ratio of the facility's performance. However, one of the issues with the PUE is that it does not account for the climate of the location of the data center and does not necessarily account for efficiency when viewed alone without consideration for facility energy use. Because a PUE is a simple ratio of IT energy to facility energy, operation of the equipment in the data center racks is critical to overall system efficiency. Full psychrometric conditions must be taken into account when looking at efficient operation. Climates with lower energy states (e.g., colder, drier) allow for smaller cooling systems because data centers in these climates can transfer heat energy to the external environment without additional mechanical cooling. As cooling systems typically consume approximately 30-40 percent of the energy in a data center, building a data center in a lower energy state climate requires less energy and, therefore, results in an overall cost savings.

In many instances, a data center cannot be located by climate alone but must be located due to physical adjacencies in local communities. In these instances, the adaptability of free cooling in both climates with lower energy states (e.g., colder, drier) and climates with higher energy states (e.g., warmer, humid) is critical. The cooling technology of the data center is designed to use the minimal amount of mechanical cooling to accommodate removal of heat from the facility. Free cooling is based on the total energy available in the external air and is based upon the psychometrics of the air taking into account both temperature and moisture content.

FIG. 7A illustrates a map of North America and Central America showing a percentage of the year that full free cooling is achieved. FIG. 7B is a table of free cooling for selected cities in North America and Central America. The table includes % free cooling, partial power usage effectiveness (pPUE), power usage effectiveness (PUE), projected 1 MW 10-year savings vs. a system with a PUE of 1.5, and projected 1 MW 10-year savings vs. a system with a PUE of 2. The table assumes a temperature of 75.2° F. and a relative humidity of 65%. The pPUE includes all losses from cooling, controls, and lighting within the data center. The PUE includes all losses from cooling, control, and lighting within the data center, as well as the primary electrical infrastructure based on 2N, 95% efficient uninterruptable power supply (UPS), and N+1 generators. The projected 10-year savings figures are based on an energy cost of 10¢ per kWh and a 5% annual energy price inflation rate. For example, a data center in Anchorage, Alaska has 100.00% free cooling, a pPUE of 1.05, a PUE of 1.14, a projected 1 MW 10-year savings vs. a system with a PUE of 1.5 of $3.97 million, and a projected 1 MW 10-year savings vs. a system with a PUE of 2 of $9.48 million. A data center in Orlando, Florida has 39.22% free cooling, a pPUE of 1.20, a PUE of 1.31, a projected 1 MW 10-year savings vs. a system with a PUE of 1.5 of $2.09 million, and a projected 1 MW 10-year savings vs. a system with a PUE of 2 of $7.60 million.

Figure 8:
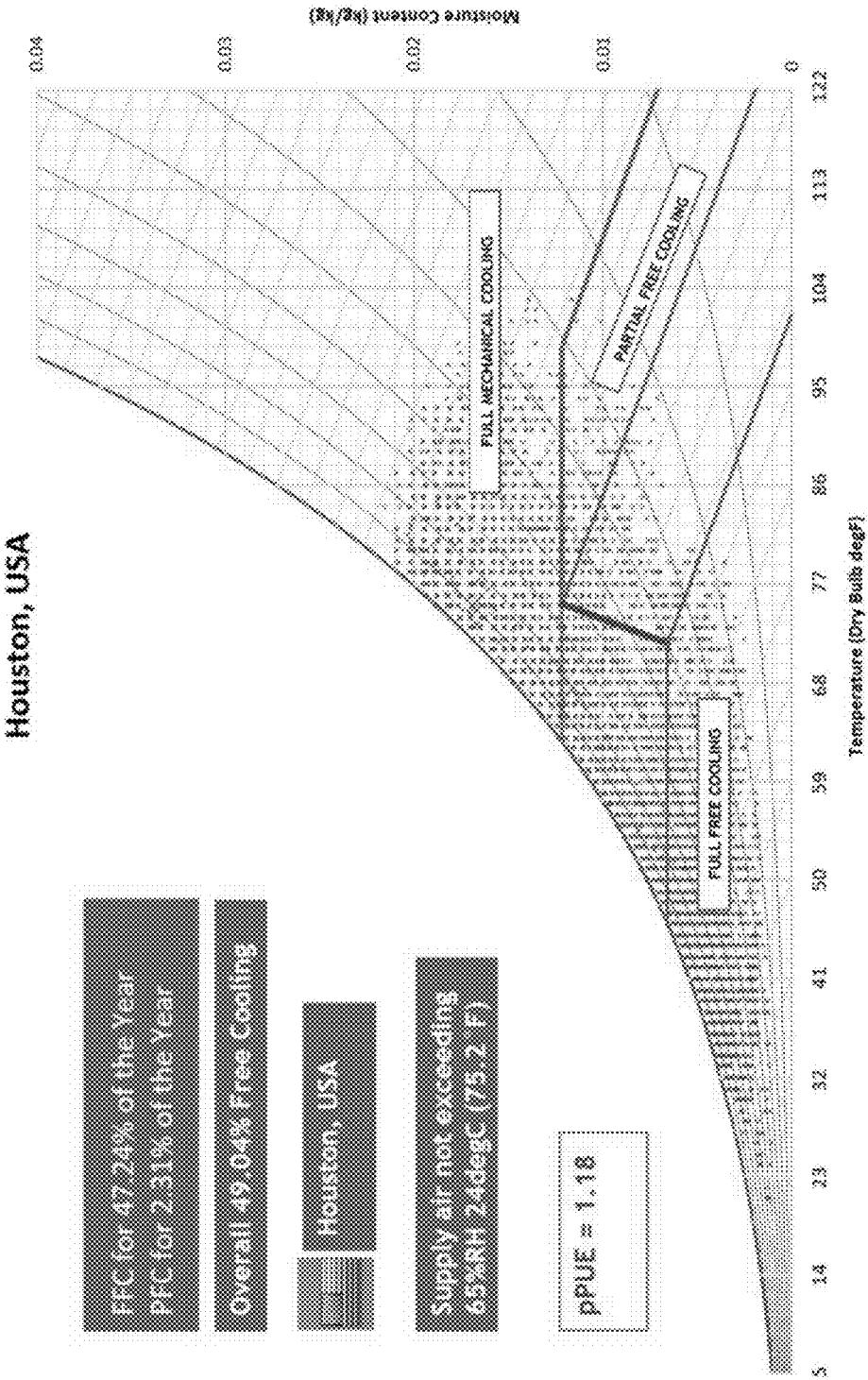
FIG. 8 is a graph illustrating power usage effectiveness (PUE) in Houston, Texas.

FIG. 8 is a graph illustrating power usage effectiveness (PUE) in Houston, Texas. In example shown in FIG. 8, the data center has supply air not exceeding 65% relative humidity (RH) and a temperature of 24° C. (75.2° F.). The data center is able to obtain full free cooling (FFC) for 47.24% of the year and partial free cooling (PFC) for 2.31% of the year, resulting in an overall free cooling of 49.04% of the year. This results in a partial power usage effectiveness (pPUE) of 1.18. The pPUE includes all losses from cooling, controls, and lighting within the data center.

Figure 9:
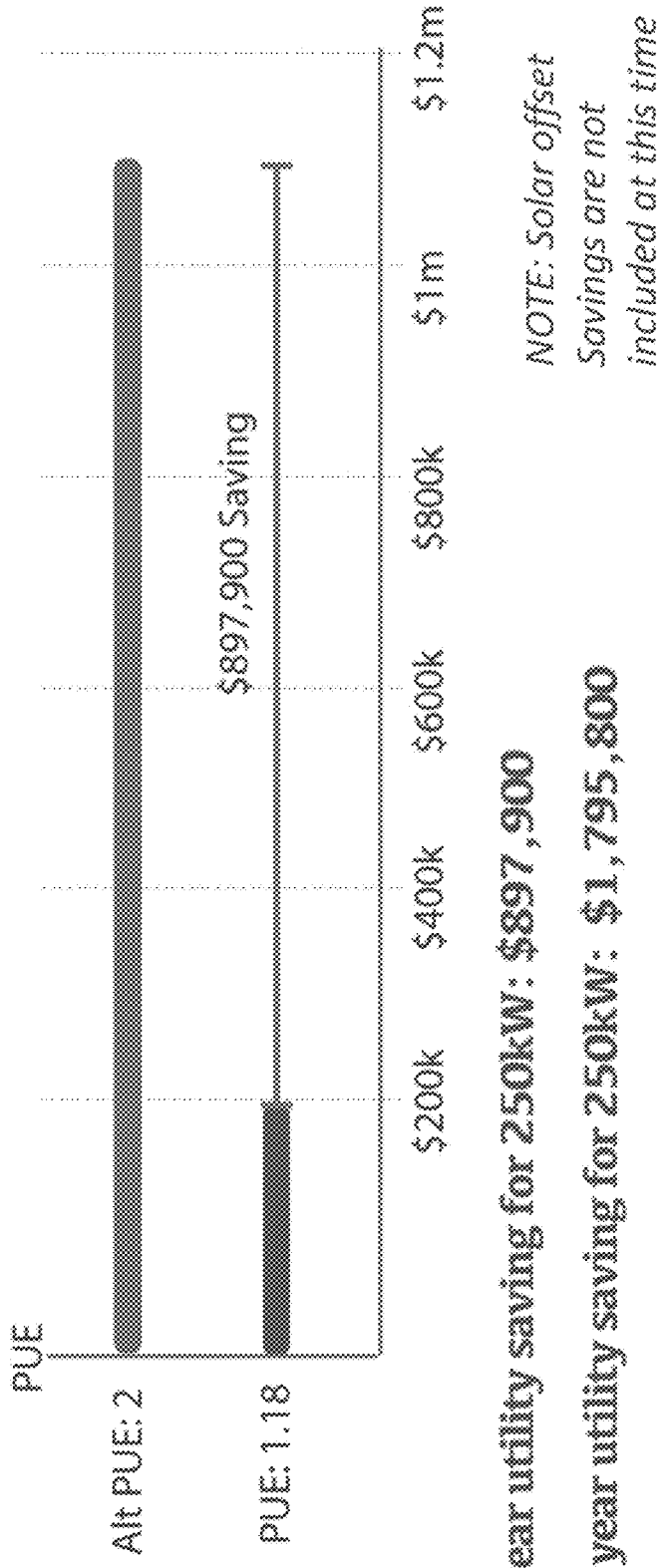
FIG. 9 is a graph illustrating 5-year utility savings.

FIG. 9 is a graph illustrating 5-year utility savings vs. a system with a PUE of 2 in Houston, Texas. The figures assume 100% IT load and an energy cost of 10¢ per kWh. The 5-year utility savings vs. a system with a PUE of 2 in Houston, Texas is $897,900. The 10-year utility savings vs. a system with a PUE of 2 in Houston, Texas is $1,795,800.

In a preferred embodiment, the modular data center includes at least one site microgrid. Examples of a site microgrid and/or components thereof include U.S. Pat. Nos. 9,186,378, 9,570,753, 9,577,242, and 9,800,051, each of which is incorporated herein by reference in its entirety.

In one embodiment, the site microgrid includes at least one power converter connected to a DC bus. In another embodiment, at least one energy storage device is connected between a positive rail of the DC bus and a negative rail of the DC bus. At least one energy generation device (e.g., solar module, wind turbine) supplies power to the at least one power converter, which is converted to a DC voltage on the DC bus. The DC voltage is converted into AC power using an inverter. The AC power is supplied to at least one power consuming device and/or a utility grid. In one embodiment, the at least one energy storage device includes a DC to DC converter. The at least one energy storage device is a lead-acid battery, a lithium ion battery, a zinc bromide battery, a zinc chloride battery, a flow battery (e.g., ZnHBr, ZnFe, CeZn, vanadium), or any other suitable energy storage device. In another embodiment, the inverter is configured for bidirectional power transfer between the DC bus and the utility grid.

In one embodiment, the at least one energy storage device is charged during periods of peak production by a renewable energy source (e.g., solar module, wind turbine). Additionally, or alternatively, the at least one energy storage device is charged by the utility grid. The at least one energy storage device is preferably operable to supplement energy provided by the at least one energy generation device when the at least one energy generation device is generating less energy than required by the system loads. In another embodiment, the at least one energy storage device includes at least two energy storage devices. The at least two energy storage devices include a first energy storage device with a first chemical composition and a second energy device with a second chemical composition, wherein the first chemical composition is different from the second chemical composition.

Figure 10:
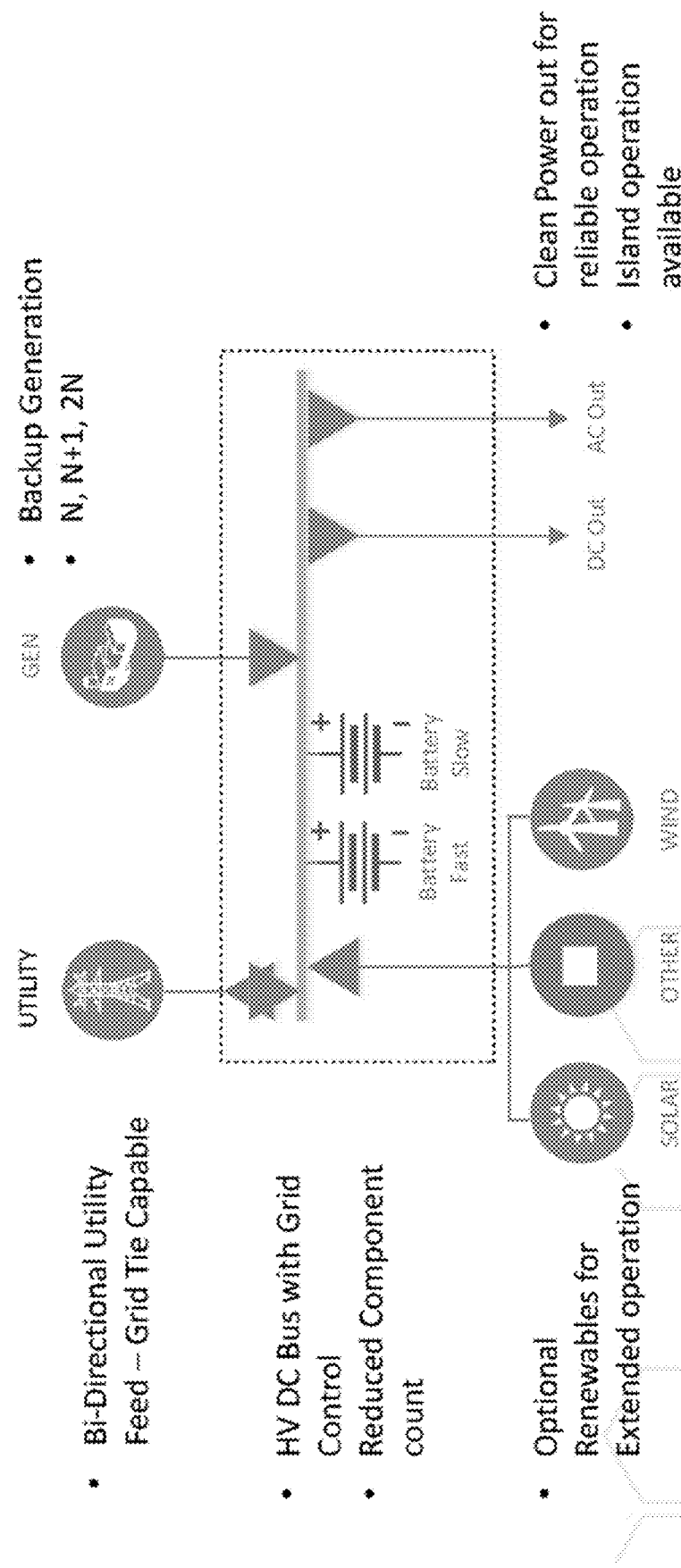
FIG. 10 illustrates a modular power block direct current (DC) collector bus.

FIG. 10 illustrates a high-level overview of one example of a site microgrid. A modular power block direct current (DC) collector bus is connected to a utility grid via a bi-directional rectifier/inverter module. A rectifier converts voltage from the utility grid from an AC voltage to a DC voltage. The DC bus is also connected to at least one solar module. In one embodiment, a DC-DC converter is used to convert the voltage of the at least one solar module to the voltage of the DC bus. The DC bus is connected to at least one wind turbine. In one embodiment, the at least one wind turbine produces an AC voltage and a rectifier converts voltage from the wind turbine from the AC voltage to a DC voltage. The rectifier is preferably an active rectifier. The DC bus is connected to at least one generator. A rectifier converts voltage from the at least one generator from an AC voltage to a DC voltage.

The DC bus is connected to at least one battery. In one embodiment, the at least one battery includes at least one battery with a composition that charges and/or discharges faster than at least one battery with a different composition. In a preferred embodiment, the at least one battery is connected to the DC bus via a DC-DC converter.

The DC bus is operable to supply power to at least one load. The at least one load is a DC load and/or an AC load. The DC load is connected to the DC bus via a DC-DC converter that converts the voltage of the DC bus to the voltage required by the DC load. The AC load is connected to the DC bus via an inverter that converts the voltage of the DC bus to an AC voltage with a correct amplitude and frequency for the AC load. In one embodiment, the system is configured for bi-directional power transfer between the DC bus and the at least one load or the utility grid.

In a preferred embodiment, the modular data center includes at least one digital power system. Examples of a digital power system include U.S. Pat. Nos. 8,781,637, 9,184,795, 9,419,436, and 9,853,689, U.S. Patent Publication Nos. 20170214236 and 20170229886, and WIPO Publication Nos. WO2014089329, WO2015109193, WO2016064727, WO2016073813, WO2017127797, and WO2017139289, each of which is incorporated herein by reference in its entirety.

The at least one digital power system includes at least one digital power transmitter. The at least one digital power transmitter is operable to convert analog electrical power to at least one discrete energy packet to distribute across a set of transmission lines. At least one digital power receiver is connected to the set of transmission lines. The at least one digital power receiver is operable to accept the at least one discrete energy packet from the at least one digital power transmitter and convert the at least one discrete energy packet back into analog electrical power for use by at least one load device.

Figure 11:
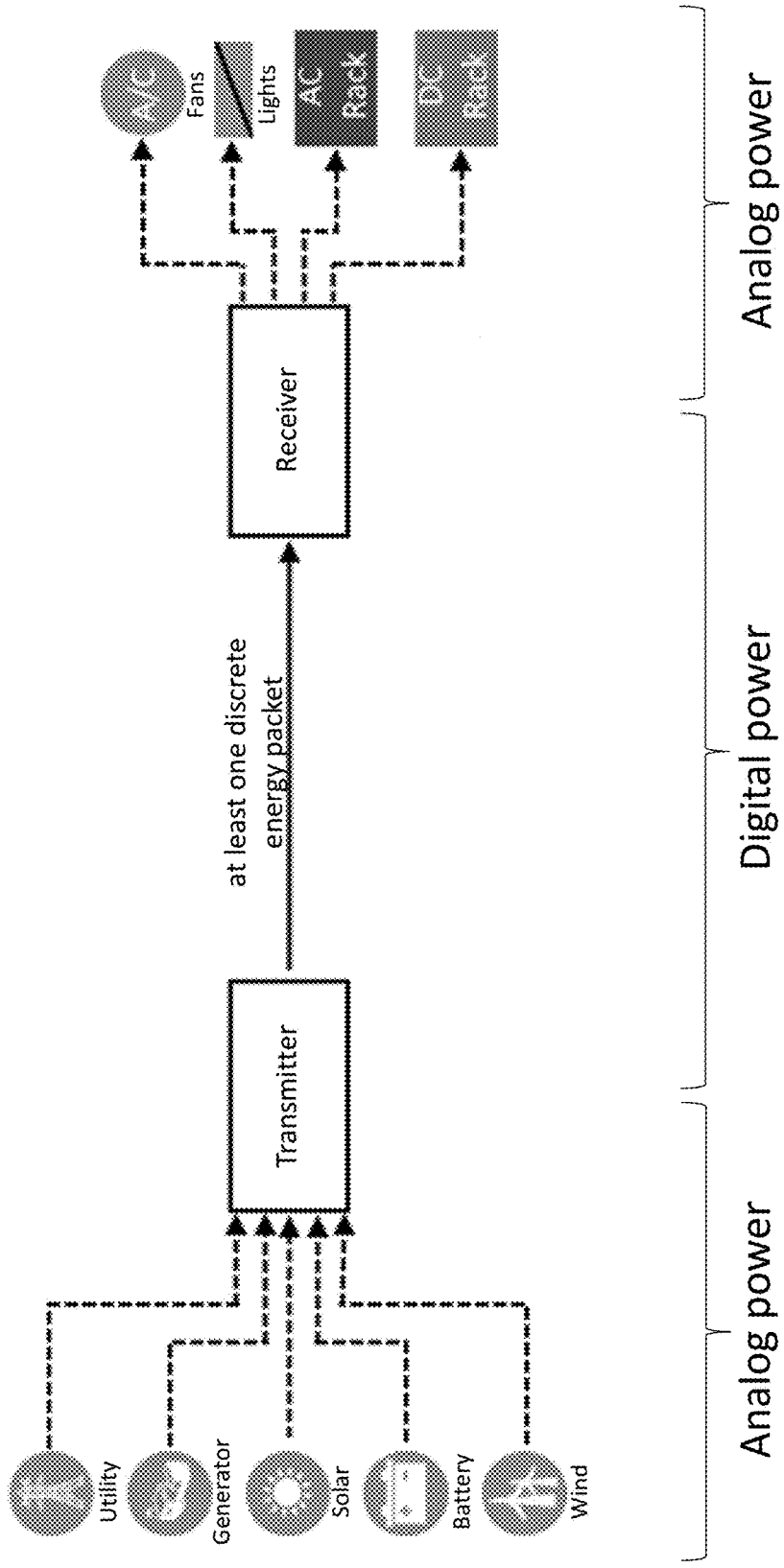
FIG. 11 illustrates one example of a digital power system.

FIG. 11 illustrates the process of converting analog power to digital power and then back to analog power. AC or DC analog power from a utility grid, at least one generator, at least one solar module, at least one battery, and/or at least one wind turbine is converted into digital power by at least one transmitter line card. In one embodiment, approximately 700 packets of digital power are sent every second over a two-conductor cable. The at least one transmitter line card preferably performs a safety check after every digital electricity packet transmission. At least one receiver converts the digital power back into analog power. In a preferred embodiment, the at least one receiver converts the digital power back into analog power at a correct voltage and a correct power level for a corresponding remote load. In one embodiment, the process of converting analog power to digital power and then back to analog power uses a mobile application and/or at least one in-band data channel to policy control power delivery (e.g., ON, OFF, LEVEL, DIM, RESET).

Figure 12:
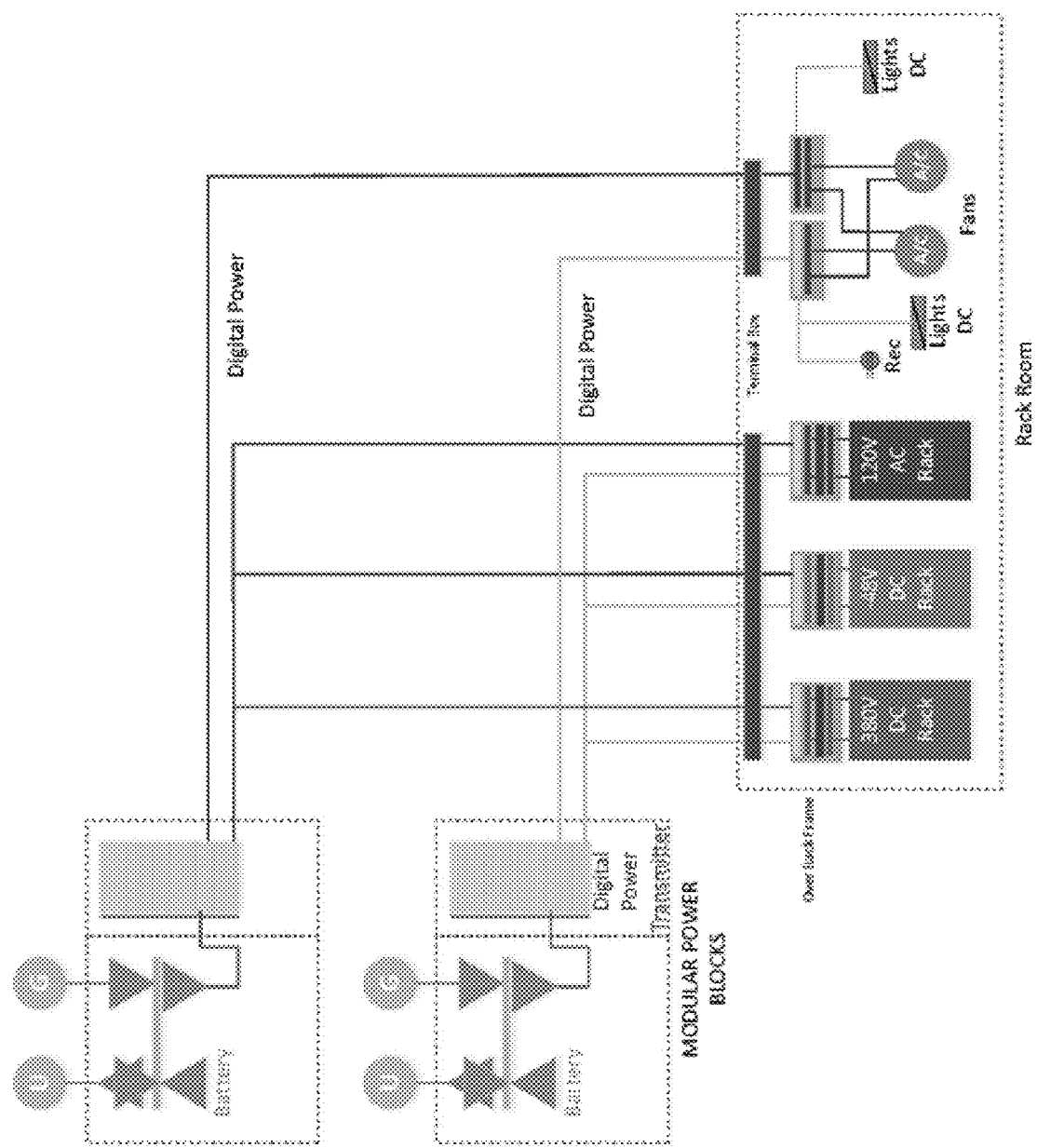
FIG. 12 illustrates one embodiment of a power arrangement for a modular data center.

FIG. 12 illustrates one embodiment of a power arrangement for a modular data center. The example in FIG. 12 includes two modular power blocks. Each modular power block includes a DC bus. The DC bus is connected to a utility grid via a rectifier. The DC bus is also connected to at least one generator via a rectifier. The DC bus is connected to at least one battery. Voltage from the DC bus passes through a DC-DC converter to a digital power transmitter. The digital power transmitter converts analog power to at least one discrete energy packet to distribute across a set of transmission lines. A digital power receiver is connected to the set of transmission lines. The digital power receiver accepts the at least one discrete energy pack and convers the at least one discrete energy packet back into analog power for use by at least one load device. The at least one load device is a DC load and/or an AC load. In the example shown in FIG. 12, the at least one load device includes a first DC rack (e.g., 380V), a second DC rack (e.g., -48V), an AC rack (e.g., 120V), DC lights, and AC fans.

Figure 13:
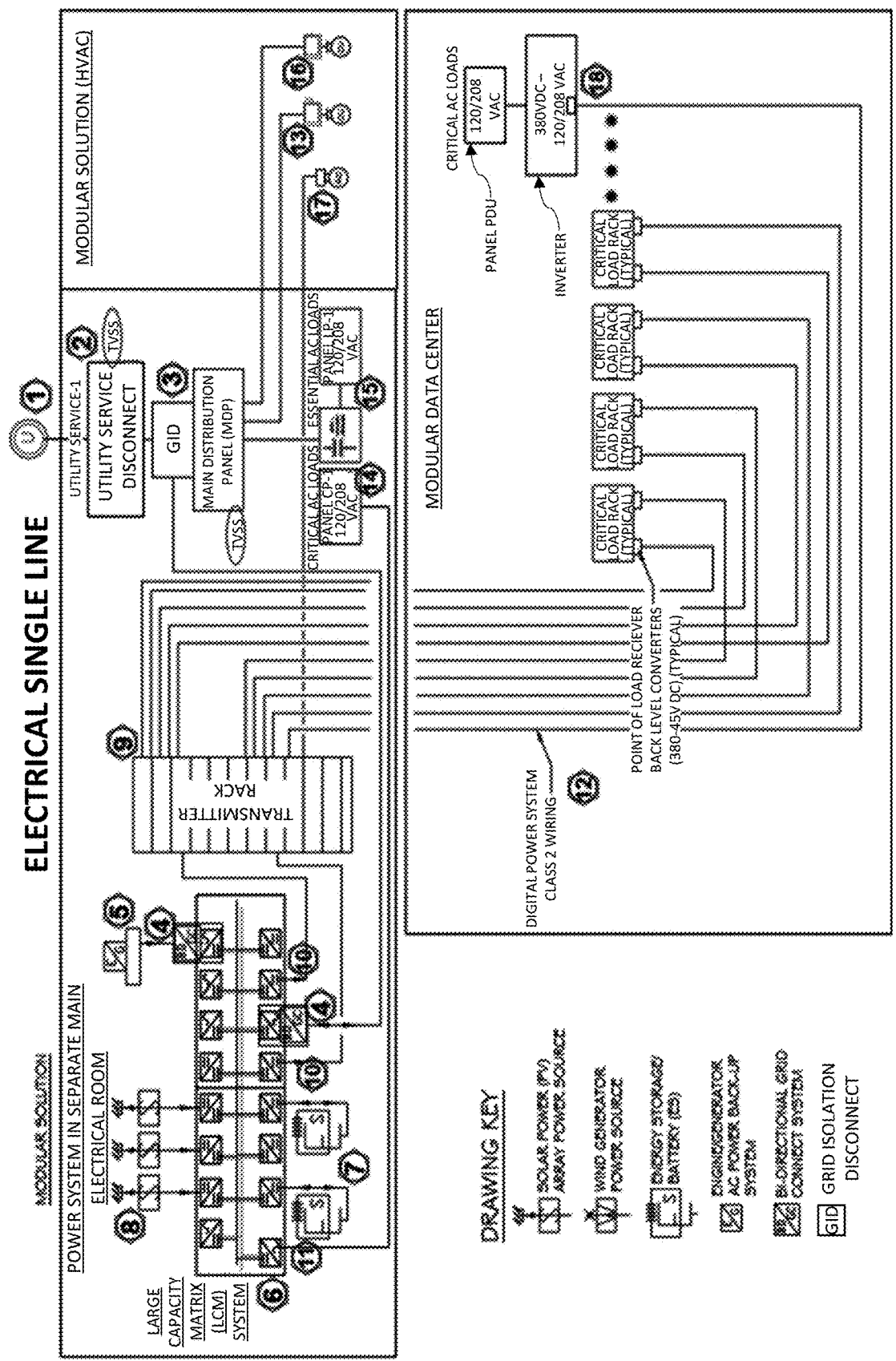
FIG. 13 illustrates an electrical plan for one embodiment of a modular data center.

FIG. 13 illustrates an electrical plan for one embodiment of a modular data center. A DC bus is connected to a utility grid via a rectifier. The connection to the utility grid includes a switch to disconnect utility service and a grid isolation disconnect switch. The system is configured for bi-directional power transfer between the DC bus and the utility grid. The DC bus is also connected to a generator via a rectifier. The system is configured for bi-directional power transfer between the DC bus and the generator. The DC bus is connected to at least one energy storage device (e.g., battery) via a DC-DC converter. The DC bus is connected to at least one solar module (e.g., three solar modules) via a DC-DC converter. In another embodiment, the DC bus is connected to at least one wind turbine (not shown) via a rectifier.

Voltage from the DC bus passes through a DC-DC converter to a digital power transmitter. The digital power transmitter converts analog power to at least one discrete energy packet to distribute across a set of transmission lines. In one embodiment, the set of transmission lines is formed of class 3 power wiring. A digital power receiver is connected to the set of transmission lines. The digital power receiver accepts the at least one discrete energy packet and convers the at least one discrete energy packet back into analog power for use by at least one load device. The at least one load device is a DC load and/or an AC load. In one embodiment, a DC-DC converter converts the voltage from the digital power receiver to the voltage required by the DC load. In another embodiment, the voltage from the digital power receiver is passed through an inverter to convert the voltage to AC voltage for the AC load.

The digital power system equipment transports electrical energy over class 3 wiring in a cable basket or tray to a location fixed above each equipment rack or cabinet where it is directly utilized or converted to the appropriate electrical voltage and frequency. This embodiment eliminates a traditional series electrical topology and provides multiple parallel pathways through the data center space.

The data center design, site microgrid, and digital power system are combined in a unique manner and each technology is adapted to fit into and meet the particular need of the arrangement. Traditional data centers are built around larger capacity facilities and structures. The present invention includes data center layouts and designs that are more material efficient and built around a smaller scale footprint and capacity. The blending of data center delivery technologies (i.e., volumetric and chassis designs) as well as the modification of layout in standard data center design were used to achieve the present invention.

Traditional data centers use an A/B Bus and an AC voltage distribution system. In the present invention, standard AC distribution was removed to accommodate the site microgrid. In addition, standard AC distribution was removed to accommodate digital power delivery between the site microgrid and the equipment rack space. The digital power system distributes power over class 3 low power connections and therefore does not need busway conduits, circuit breakers, switchboards, junction boxes, and similar standard AC power components.

Figure 14:
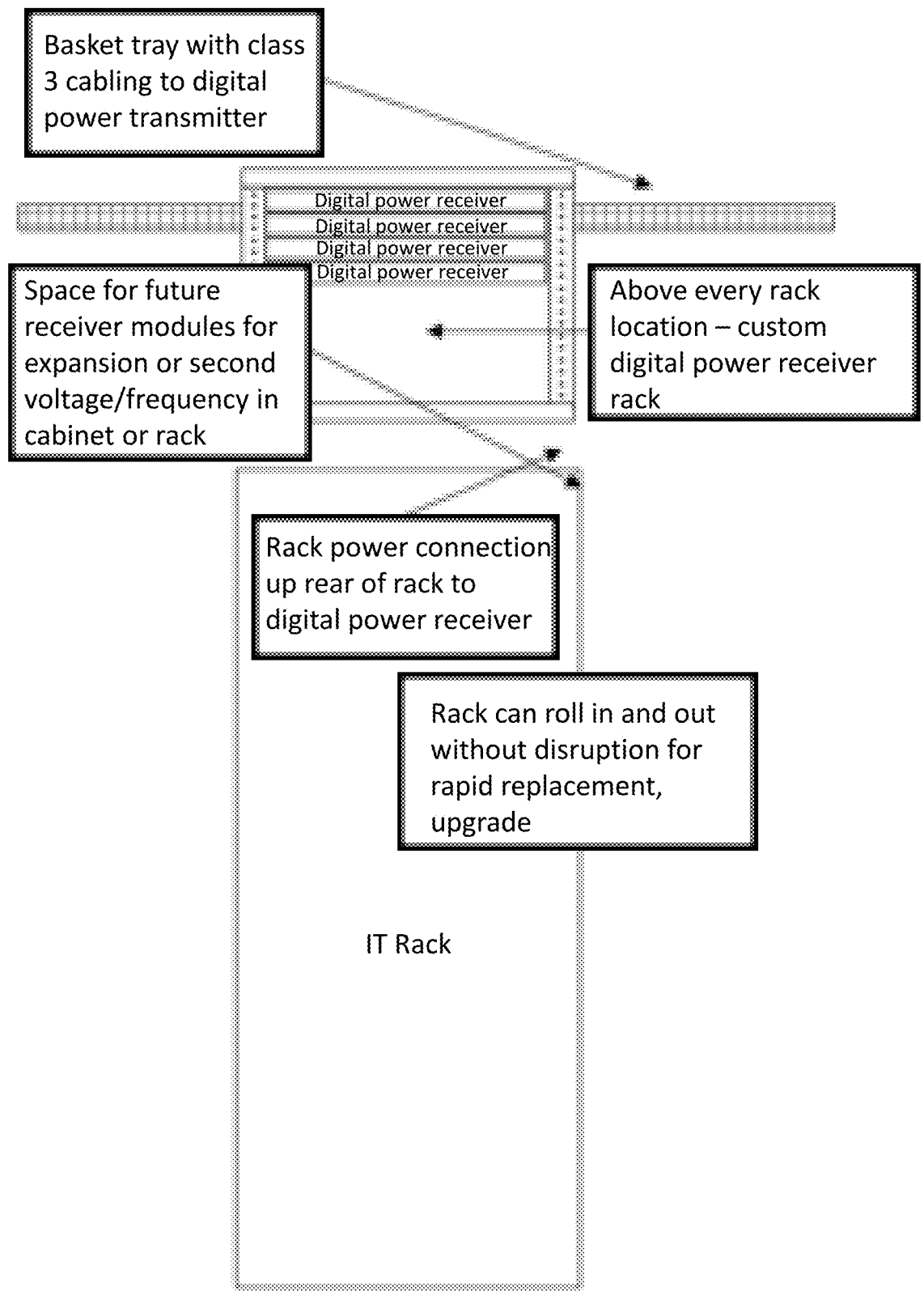
FIG. 14 illustrates one embodiment of a basket tray for power distribution.
Figure 15:
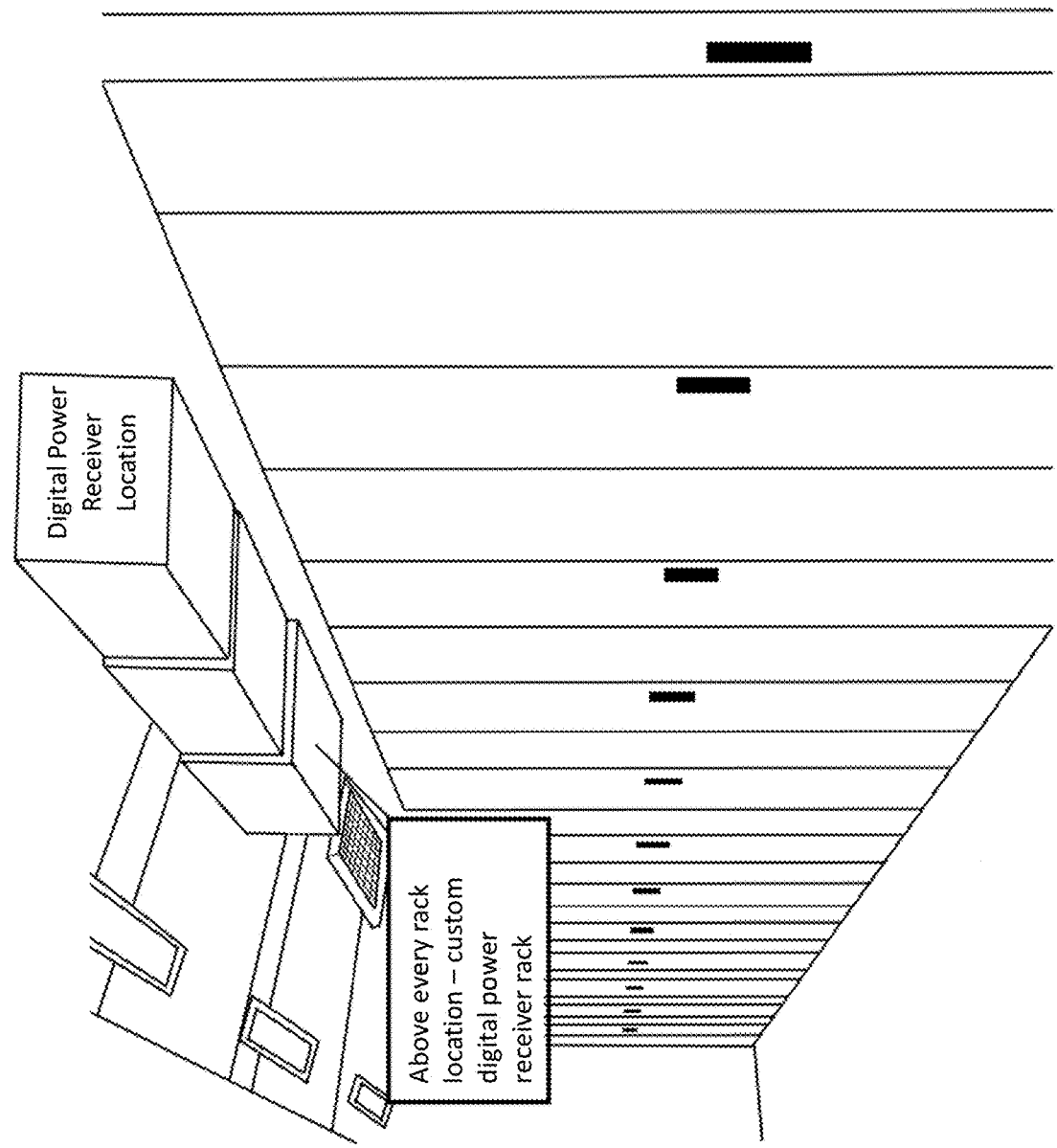
FIG. 15 illustrates one embodiment of a location of a basket tray for power distribution relative to a rack or cabinet.
Figure 16:
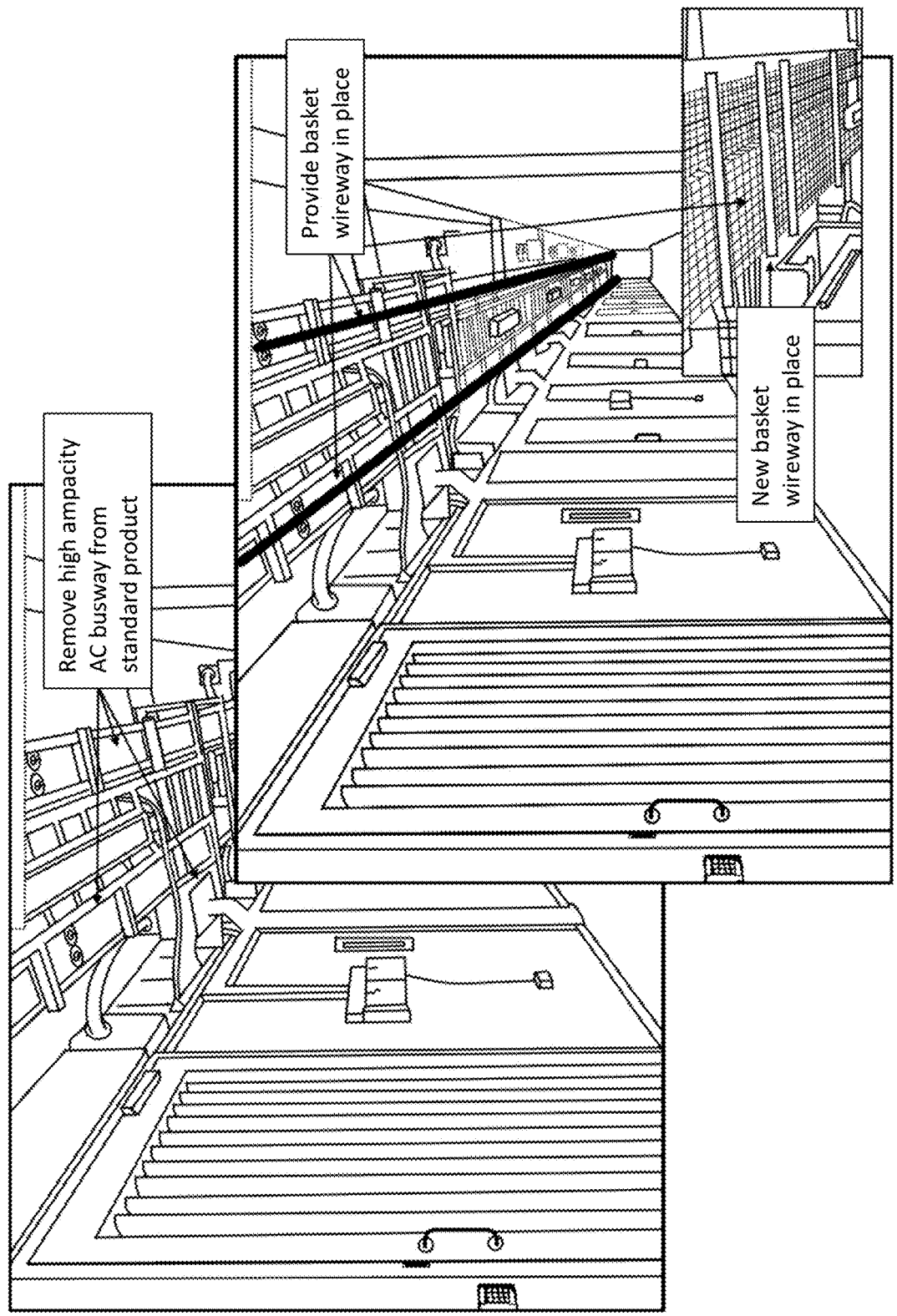
FIG. 16 illustrates one embodiment of a basket tray wireway.

Additionally, a unique fitting has been developed with a standard cassette above each rack to house the receiver equipment for the digital power system technology. This unique fitting allows for all power delivery components to be factory mounted and installed prior to delivery onsite. Advantageously, this provides for increased quality control and improved delivery times. The AC power busway has been removed from the data center and substituted with a basket tray for power distribution over small gauge copper pair wiring. FIG. 14 illustrates one embodiment of a basket tray for power distribution. The basket tray has class 3 cabling to the digital power transmitter of the digital power system. Additional space is provided for future digital power receiver modules for expansion, a second voltage, and/or a second frequency in the cabinet or rack. Power connections extend up a rear of the rack to the digital power receiver. The rack is operable to roll in and out without disruption for rapid replacement and/or upgrade. FIG. 15 illustrates one embodiment of a location of a basket tray for power distribution relative to a rack or cabinet. FIG. 16 illustrates one embodiment of a basket tray wireway. The high ampacity AC busway is removed from the standard product and a basket wireway is provided.

The site microgrid technology has been completely adapted to fit within the modular data center. In one embodiment, a standard EnSync SuperModule™ is deconstructed and a new hot swappable overhead busway connection system is installed, which expands capability and features for concurrent maintenance and operation of any module component.

Figure 17:
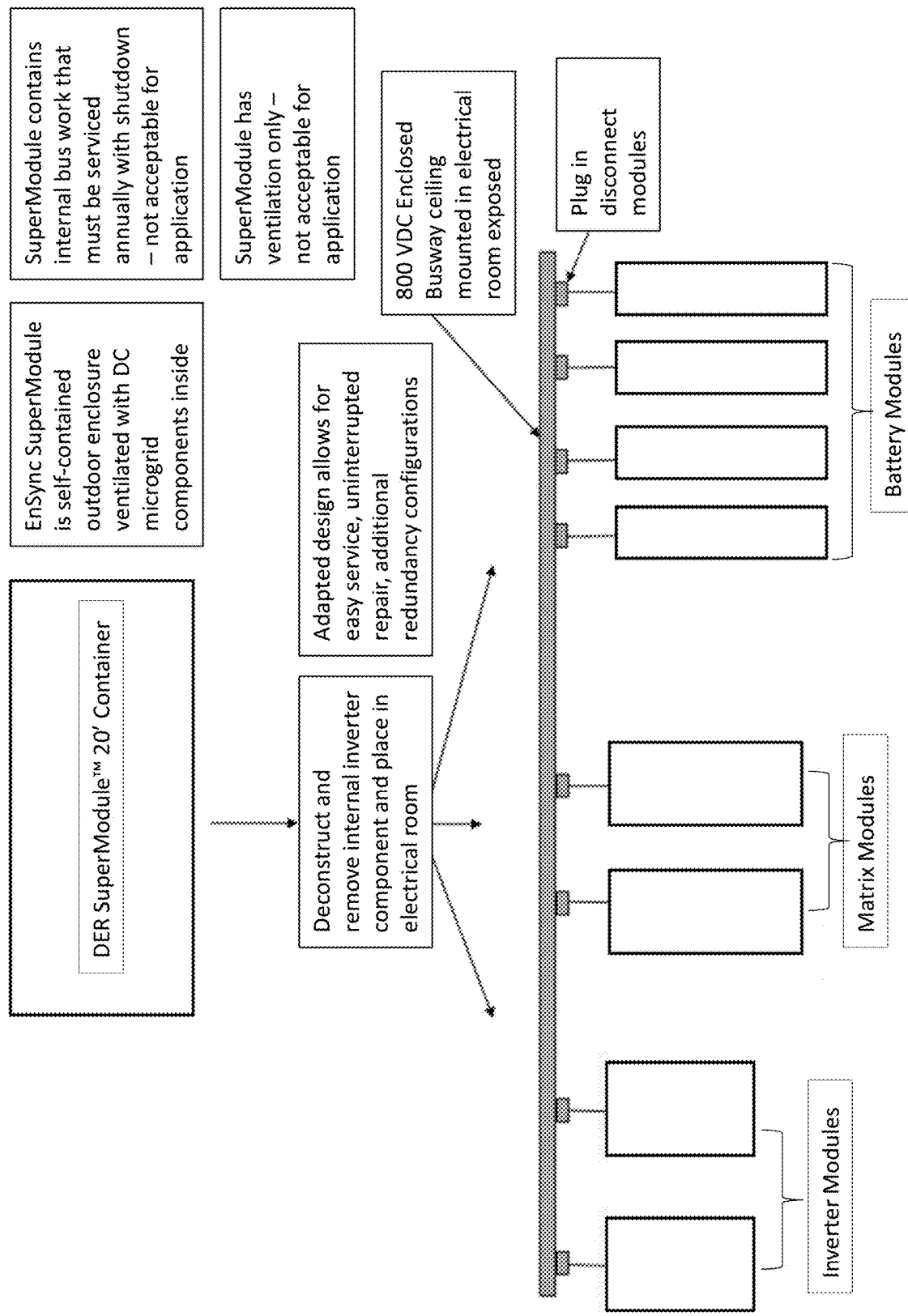
FIG. 17 illustrates one embodiment of the site microgrid technology.

FIG. 17 illustrates one embodiment of the site microgrid technology. The EnSync SuperModule™ is a self-contained outdoor enclosure ventilated with DC microgrid components inside. However, the SuperModule™ has ventilation only and contains internal bus work that must be serviced, which are not acceptable for the modular data center application. The SuperModule™ is deconstructed, internal inverter components are removed, and the internal inverter components are placed in the electrical room. This adapted design allows for easy service, uninterrupted repair, and additional redundancy configurations. In the example shown in FIG. 17, the system includes an 800 VDC enclosed busway ceiling mounted in the electrical room. The electrical room includes inverter modules, matrix modules, and battery modules. The matrix modules include energy management technology. The energy management technology includes active energy synchronization for any or all DC and AC inputs and output without a system controller or complex algorithms, management of power and energy storage, frequency regulation, demand response, rate shifting, peaking shaving, demand charge clipping, DC output management and control, maximum power point tracking, islanding, and/or power factor correction. In one embodiment, the DC output from the collector bus is adapted down from 380 VDC to 336 VDC to accommodate the digital power system technology directly.

Several advantages are a direct result of the unique combination of equipment in the present invention. The rearchitecting of the electrical distribution system allows for consolidation and removal of many components (e.g., busway, plug modules, conduits, circuit breakers, switchboards, fittings, support structure, junction boxes) within the system. The reduced component count increases reliability, reduces cost of materials and components, and simplifies operation. This provides a significant benefit for improvement of reliability, especially at unmanned facilities. Independent operation and self-healing characteristics are contained within the data center of the present invention.

One of the key advantages of the present invention is the ability to eliminate stranded capacity in a data center. Stranded capacity is a term that defines lost capacity in a facility that is due to a physical arrangement that is dedicated to a particular area. In the case of a mechanical system, this may be due to dedicated air distribution capacity to a particular rack or zone. Similarly, the electrical system often has stranded capacity due to bulk power delivery to a localized area. Centralization of the air distribution allows for delivery at any rack, any time, self-adjusting. It eliminates the concept of "hot spots" in a data center, and by design delivers appropriately conditioned air where it is needed at the hardware intake. Capacity can be delivered to any, all, or one of the racks at any time but the equipment demand itself determines the distribution, not a complex active control system.

Stranded capacity is eliminated on the electrical side in two ways. At the front end, the application of a high voltage DC microgrid allows for easy capacity change in the life-cycle of the facility. By eliminating series connected electrical topologies and providing resources in parallel, system expansion is simplified. By using DC power instead of AC power to transport energy from the main distribution system to the rack location there are significant energy savings and efficiency gains. There are also lower system losses using high voltage DC instead of low voltage DC. Advantageously, this reduces the amount of heat required to be removed from the facility by the air conditioning system due to system losses.

The digital power system technology allows for the redesign of the electrical topology in a manner that any rack or portions of a rack (e.g., mixed use application) in the data center are operable to house traditional AC powered equipment (e.g., multiple voltage classes); low voltage DC Power (e.g., −48V Telco Systems® Style); high voltage DC at 380 Volts; or 336 Volt DC. In the specific case of 336 Volt DC, the voltage class is preferred because in many cases it simplifies the direct application of DC power to an AC power supply on a server. Many of the larger original equipment manufacturer (OEM) power supply manufacturers dual rate their power supplies. Advantageously, 336 VDC passes through the first AC to DC conversion layer on many modern power supplies, allowing the AC power supply to operate on DC power at a higher efficiency because the first stage of conversion is generally bypassed. This effect also has a compounding related effect on the cooling system heat removal capability. Energy saved no longer needs to be extracted from the facility so additional compounded savings are achieved.

Incorporation of the digital power system technology into the data center also allows for a paradigm shift in electrical topologies. By locating the digital power system transmitter at the top of the systems and distributing to a rack from multiple transmitters, a star topology of power distribution is achieved. This star topology eliminates the traditional series distribution system which typically was arranged in varied levels of complexity. These varied levels are often laid out in order as power moves from entrance to load in a series topology in stages as follows: from utility connection through a large switchboard or switchgear to a transfer switch to transformers to a switchboard to an Uninterruptable Power System (UPS) to a switchboard to a transformer to a panelboard to branch circuit to a rack. Each layer often has additional multiple series components as bulk power at the start of the chain is divided into smaller and smaller components until the rack is reached. Each stage of the system has a fixed capacity to a portion of the facility. If power planned for one portion of the facility is needed elsewhere in the facility, it becomes very difficult or disorganized to distribute it there. In a traditional data center this large series connection is often doubled for redundancy and protection of operation.

Application of the digital power system technology to the present invention dramatically changes the architectural layout and complexity. A DC transmitter is placed at the top-level DC bus and a receiver is placed in the rack. Power distribution is accomplished via means of a low energy class 3 power cable directly from the bulk top level to the rack via many parallel connections. These connections are easy to relocate across any portion of the facility to any rack location. Further, all series switchboards and series components are eliminated. This also eliminates stranded capacity from the system. Any rack is now operable to receive power from independent transmitters, which eliminates single points of failure. This topology allows for the determination of a redundancy arrangement at time of use instead of at time of construction. Advantageously, individual racks can now be N, N+1, 2N, or 2(N+1) or any other topology arrangement desired by simply changing the source transmitter location. Further, this can easily be changed at any point in the lifecycle of the facility on a circuit by circuit basis. In one embodiment, an arrangement for power delivery from the new architecture is as follows: power input from multiple sources in parallel (e.g., utility, solar, generator, battery) to bus to digital power system transmitter to rack.

Removal of additional electrical components and using a smaller conductor size at a higher voltage DC uses significantly less material at the time of manufacture, which brings down production costs and reduces the global impact from the manufacturing of a single facility. In one example, the conductor size reduction is approximately an 8 to 1 ratio. Further, significant carbon dioxide offsets are achieved with the reduced carbon footprint. The significant energy savings achieved through the design of the facility also adds to the carbon footprint savings. Installation of power cables as class 3 installation in a basket tray requires significantly less infrastructure, materials, labor, and resources when compared to traditional 600 VAC distribution using industry standard means and methods. All of these changes contribute to a reduction in carbon footprint from the manufacture of the facility through the use of the facility.

Additional intelligence is achieved by application of the digital power system technology. Each circuit is fully monitored and controlled by the digital power system. This additional data is incorporated into the facility central monitoring system, offering enhanced visibility into the power system. The data available is significantly expanded from data available on a traditional system. This has the direct effect of enhanced energy monitoring, root cause failure analysis improvement, and a significant reduction in an average time to repair improvements.

Energy savings are achieved with the combination of the data center design, digital power system, and site microgrid at multiple stages and have a compounding effect. Efficiency gains of 10% can be attributed to the use of a DC microgrid. Elimination of transformation and components in the electrical distribution system can save an additional 5% of losses in the system. Moving to high voltage DC distribution can save an additional 5% losses over industry standard DC distribution. Feeding equipment at high voltage DC directly has another efficiency gain component of 5%. As a result, 23% energy gains can be achieved within the data center of the present invention.

Any loss in a facility results in heat that is required to be removed by the cooling plant or air conditioning system. For example, 1 watt of heat generated by electrical equipment within a data center facility typically requires another 0.7 watts of power to remove it. By not generating this heat from losses, the end meter energy savings is nearly doubled. The efficiency of the cooling technology of the present invention saves additional energy as it can consume as little as 0.09 W to remove 1 W of heat from the facility. When renewable sources of energy are factored into the microgrid and all utility transmission losses are eliminated from the equation (estimated by some to be 40% of the total energy demand at the generation plant) through the use of distributed generation and localized renewables, significant energy savings is achieved. This portion of the energy savings is not seen at the customer meter but it has a dramatic reduction of carbon dioxide output globally for the support of the facility.

The unique combination of the DC microgrid and the digital power system allows capacity planning and directed control to the IT Hardware to manage the microgrid from a capacity standpoint. As the available power from renewables (e.g., wind turbines, solar panels) ramps up and down (i.e., with wind speed or available solar output), the system can gather a reliable capacity projection and also monitor the actual use real-time use. The capacity projection feeds into a software platform that connects to information technology hardware via a standard protocol (e.g., SNMP, IPMI) where it can command servers directly to either go idle or process to match available energy generation against consumption. Batteries are used in the microgrid to flatten the demand curve. Advantageously, this application uses significantly fewer batteries, allowing for the lowest capital cost to build. This also provides the advantage of allowing intensive processor applications (e.g., blockchain verification, cryptocurrency mining, proof of stake, proof of work) to work at maximum output to available energy.

In a preferred embodiment, the modular system, from a small (e.g., 5) rack facility to the large enterprise class (e.g., 100+) rack facility, has commonality of modular components. As facilities get larger, more modular parts are applied such that a larger facility is really just a combination of smaller ones. This has a direct effect on maintenance and repair capabilities within an enterprise organization and as a result all activities in these areas are improved dramatically. The same modules, components, parts, and distribution equipment are used at facilities from small to large. Inventories of spare parts are significantly reduced for an organization. Deployment and repair times are dramatically improved across a geographic footprint. Within a repair fleet this impacts even fuel consumption for truck rolls to a facility because less parts are needed to cover more repairs, so the trucks can stock fewer parts of lesser weight and save fuel over the millions of fleet road miles. Because the parts are lighter due to higher voltage delivery, less fuel is also consumed during transport and repair. In a preferred embodiment, all digital power system transmitter and receiver pairs are identical, which requires a small spare parts stock and inventory.

In one example, the modular data center is customized for a Multiple System Operators (MSO) operator or a traditional cable broadband company. MSO is a term used in the cable industry to describe a company that owns and operates two or more cable TV systems. This industry has unique challenges as it adapts its geographic footprint of facilities from its original purpose of transmitting an analog TV signal to a complete IP based delivery model. The architectural footprint of a cable operator is hierarchal from large datacenters out to headend aggregation facilities to hub site facilities and out to nodes and then the customer premises. Each layer has a multiplication of the number of facilities. For example, one large cable company can have 10 datacenters, 100-200 primary headends, 200-400 secondary headends, 1000 hubsites, and 100,000 nodes. The present invention supports everything inclusive of datacenters through to hubsites. Traditional facilities in this market are designed to support an average of 1.5 kW to 2.0 kW per rack load of equipment. However, new virtualized equipment racks are demanding 10 kW of electrical energy or more. As a result, the industry is rebuilding their entire network architecture to support advancing technologies and higher bandwidth requirements. This rebuild is requiring additional facilities to support the new model. These facilities must be robust and energy efficient in order to be a viable solution for the industry. Downward pressure on fees for service from the customer base runs counter to customer demands for faster service. As a for profit business, MSO operators must find a solution to offer more for the same resource. The present invention offers rapid deployment, lower cost of ownership, predictable deployment costs, significant energy saving, and future-proof adaptability flexibility with the removal of stranded capacity.

The present invention has features incorporated which are a direct result of experience obtained through several natural disaster events. In one example, a cable MSO in Florida became the communications hub for much of the community after a passing hurricane left most of the state without utility power. The cable MSO activated their WI-FI free for anyone to use and became the primary communications source for the community. The cable MSO was operating their facilities on generator power primarily via diesel fuel. However, most fuel supply companies were non-operational after the storm event. As a result, the present invention incorporates alternate sources for supply to help extend operation in natural disaster events.

The modular data center is detachable and movable. The modular data center is connectable to different power sources (e.g., utility grid, generators, batteries, solar modules, wind turbines, fuel cells). In one embodiment, the modular data center is operable to provide real time mapping of a utility grid outage. As many homes contain cable equipment, the modular data center is operable to determine that a utility grid is experiencing a power outage and an area impacted by the power outage.

In another example, facilities can be operated at diverse geographical locations and then transported to a disaster area after the fact to rapidly re-deploy services. In one example used as a basis for this invention development, California wildfires destroyed homes and knocked out utility power as well as network communications in a community and surrounding areas. Relocating a modular data center rapidly into the disaster area allows for restoration of communications, WI-FI, and broadband services to the affected community in a rapid manner. Using multiple power sources (e.g., renewable energy), restoration of these services can be achieved prior to restoration of utility power. Since this is a factory-built solution deployable rapidly (e.g., in the term of weeks), replacement facilities can be manufactured outside the impact area and brought in for rapid restoration of services. Following a disaster event, local construction trades are typically overwhelmed with the volume of restoration work and are not readily and reliably available. Often, their own residences are impacted as well. By restoring services and removing work from the scene of the disaster, efficiency gains are achieved. Workforce expansion is achieved and restoration times are dramatically reduced. The facilities are designed to be transported via intermodal shipping and can be brought to areas where they are needed.

The above-mentioned examples are provided to serve the purpose of clarifying the aspects of the invention, and it will be apparent to one skilled in the art that they do not serve to limit the scope of the invention. By way of example, the modular data center may be powered using a utility grid, at least one battery, at least one generator, at least one wind turbine, at least one solar module, at least one fuel cell, and/or other sources of energy (e.g., renewable energy). By nature, this invention is highly adjustable, customizable and adaptable. The above-mentioned examples are just some of the many configurations that the mentioned components can take on. All modifications and improvements have been deleted herein for the sake of conciseness and readability but are properly within the scope of the present invention.

What is claimed is:

1. A data center comprising:
   at least one rack housing at least one electronic component;
   a microgrid including at least one power converter connected to a direct current (DC) bus; and
   at least one digital power system including at least one digital power transmitter and at least one digital power receiver;
   wherein the DC bus is connected to a utility grid, at least one photovoltaic array, at least one energy storage device, at least one wind turbine, at least one generator, and/or at least one fuel cell;
   wherein the microgrid is operable to adjust power delivery and prompt conversion to a minimum energy use profile, by sending an independent signal to the data center; and
   wherein the at least one digital power system is operable to convert analog power to digital power and then back to analog power.

2. The data center of claim 1, further comprising at least one air circulation system.

3. The data center of claim 1, wherein at least one module is connected to the DC bus, wherein the at least one module includes at least one module for conversion of the variable DC bus voltage to a fixed DC voltage.

4. The data center of claim 3, wherein the fixed DC voltage includes approximately −54 VDC, approximately 336 VDC, and/or approximately 380 VDC.

5. The data center of claim 1, wherein at least one module is connected to the DC bus, wherein the at least one module includes at least one module for conversion of the variable DC bus voltage to a fixed alternating current (AC) voltage.

6. The data center of claim 5, wherein the fixed AC voltage includes 120 VAC at 50 Hz, 120 VAC at 60 Hz, 240 VAC at 50 Hz, 240 VAC at 60 Hz, 120/208 VAC multiphase at 50 Hz, and/or 120/208 VAC multiphase at 60 Hz.

7. The data center of claim 1, wherein at least one module is connected to the DC bus, wherein the at least one module includes a module for connection of at least one battery.

8. The data center of claim 1, wherein the data center is assembled from factory-created modules.

9. The data center of claim 1, wherein the DC bus operates between 300 VDC and 900 VDC.

10. The data center of claim 1, further comprising a fire detection system.

11. The data center of claim 1, further including at least one pressure sensor to measure pressure in the data center.

12. A data center comprising:
    at least one server or at least one telecommunications equipment;
    at least one power source including at least one power converter connected to a direct current (DC) bus; and
    at least one digital power system, wherein the at least one digital power system includes at least one digital power transmitter, a set of transmission lines, and at least one digital power receiver;
    wherein the DC bus is connected to a grid, at least one photovoltaic array, at least one battery, at least one wind turbine, at least one generator, and/or at least one fuel cell;
    wherein the at least one power source is operable to adjust power delivery and prompt conversion to a minimum energy use profile, by sending an independent signal to the data center;
    wherein the at least one digital power system is operable to convert analog power to digital power and then back to analog power; and wherein voltage from the grid, the at least one generator, the at least one photovoltaic array, the at least one battery, and/or the at least one wind turbine passes from the DC bus through a DC-DC converter to the at least one digital power transmitter.

13. The data center of claim 12, wherein the at least one digital power transmitter is operable to convert analog electrical power to at least one energy packet to distribute across the set of transmission lines.

14. The data center of claim 13, wherein the at least one digital power receiver is connected to the set of transmission lines, and wherein the at least one digital power receiver is operable to accept the at least one energy packet from the at least one digital power transmitter and convert the at least one discrete energy packet back into analog electrical power.

15. A data center comprising:
   at least one server or at least one telecommunications equipment;
   at least one power source including at least one power converter connected to a direct current (DC) bus; and
   at least one digital power system, wherein the at least one digital power system includes at least one digital power transmitter, a set of transmission lines, and at least one digital power receiver;
   wherein the DC bus is connected to a grid, at least one photovoltaic array, at least one battery, at least one wind turbine, at least one generator, and/or at least one fuel cell;
   wherein the at least one power source is operable to adjust power delivery and prompt conversion to a minimum energy use profile, by sending an independent signal to the data center;
   wherein the at least one digital power transmitter is operable to convert analog electrical power to at least one discrete energy packet to distribute across the set of transmission lines;
   wherein the at least one digital power receiver is connected to the set of transmission lines; and
   wherein the at least one digital power receiver is operable to accept the at least one discrete energy packet from the at least one digital power transmitter and convert the at least one discrete energy packet back into analog electrical power.

16. The data center of claim 15, further comprising a fire suppression system including at least one gaseous agent and/or at least one aqueous agent.

17. The data center of claim 15, wherein at least one module is connected to the DC bus, wherein the at least one module includes at least one module for conversion of the variable DC bus voltage to a fixed DC voltage and/or wherein the at least one module includes at least one module for conversion of the variable DC bus voltage to a fixed alternating current (AC) voltage.

* * * * *